(12) United States Patent
Nakagawa

(10) Patent No.: US 7,504,688 B2
(45) Date of Patent: Mar. 17, 2009

(54) SEMICONDUCTOR DEVICE WITH INTEGRATED FLASH MEMORY AND PERIPHERAL CIRCUIT AND ITS MANUFACTURE METHOD

(75) Inventor: Shinichi Nakagawa, Kawasaki (JP)

(73) Assignee: Fujitsu Microelectronics Limited, Tokyo (JP)

(*) Notice: Subject to any disclaimer, the term of this patent is extended or adjusted under 35 U.S.C. 154(b) by 0 days.

(21) Appl. No.: 11/201,212

(22) Filed: Aug. 11, 2005

(65) Prior Publication Data
US 2006/0226469 A1 Oct. 12, 2006

(30) Foreign Application Priority Data
Mar. 31, 2005 (JP) ............... 2005-100459

(51) Int. Cl.
H01L 29/788 (2006.01)
H01L 29/76 (2006.01)
H01L 29/94 (2006.01)
H01L 31/00 (2006.01)

(52) U.S. Cl. ............. 257/316; 257/390; 257/396; 257/E27.014; 257/E29.129

(58) Field of Classification Search .......... 257/316, 257/390, 396, E27.014, E29.129
See application file for complete search history.

(56) References Cited

U.S. PATENT DOCUMENTS

| | | | |
|---|---|---|---|
| 5,538,912 A | 7/1996 | Kunori et al. | |
| 6,166,958 A | 12/2000 | Naruke et al. | |
| 6,344,386 B1 | 2/2002 | Io | |
| 6,472,259 B1 * | 10/2002 | Naito et al. | 438/201 |
| 6,472,701 B2 * | 10/2002 | Yaegashi et al. | 257/296 |
| 6,559,012 B2 * | 5/2003 | Shukuri et al. | 438/275 |
| 2001/0048130 A1 | 12/2001 | Hayashi | |
| 2002/0009851 A1 | 1/2002 | Shukuri et al. | |
| 2002/0153577 A1 * | 10/2002 | Yaegashi et al. | 257/390 |

(Continued)

FOREIGN PATENT DOCUMENTS

JP 10-163456 6/1998

(Continued)

OTHER PUBLICATIONS

U.S. Appl. No. 10/872,554, filed on Jun. 22, 2004 (not yet published).

(Continued)

Primary Examiner—Ngan Ngo
(74) Attorney, Agent, or Firm—Westerman, Hattori, Daniels & Adrian, LLP.

(57) ABSTRACT

A non-volatile semiconductor memory device includes: a non-volatile memory area including gate electrodes, each including stack of a floating gate, an inter-electrode insulating film and a control gate, and having first insulating side walls formed on side walls of the gate electrode; a peripheral circuit area including single-layer gate electrodes made of the same layer as the control gate; and a first border area including: a first isolation region formed in the semiconductor substrate for isolating the non-volatile memory area and peripheral circuit area; a first conductive pattern including a portion made of the same layer as the control gate and formed above the isolation region; and a first redundant insulating side wall made of the same layer as the first insulating side wall and formed on the side wall of the first conductive pattern on the side of the non-volatile memory area.

12 Claims, 17 Drawing Sheets

U.S. PATENT DOCUMENTS

| | | | |
|---|---|---|---|
| 2003/0141540 A1* | 7/2003 | Kusumi et al. | 257/316 |
| 2003/0205776 A1* | 11/2003 | Yaegashi et al. | 257/500 |
| 2005/0035397 A1 | 2/2005 | Otoi et al. | |
| 2005/0098823 A1* | 5/2005 | Adachi et al. | 257/314 |
| 2005/0110071 A1 | 5/2005 | Ema et al. | |
| 2005/0189606 A1* | 9/2005 | Nakagawa | 257/500 |

FOREIGN PATENT DOCUMENTS

| | | |
|---|---|---|
| JP | 2000-286350 | 10/2000 |
| JP | 2002-289715 | 10/2002 |
| WO | WO 2004/039192 A1 | 5/2004 |
| WO | WO 2004/112139 A1 | 12/2004 |
| WO | WO 2004/112145 A1 | 12/2004 |

OTHER PUBLICATIONS

Chinese Office Action dated Mar. 14, 2008, issued in corresponding Chinese Application No. 2005100919801.

European Search Report issued on Sep. 30, 2008 for corresponding European patent application No. 05254538.1.

* cited by examiner

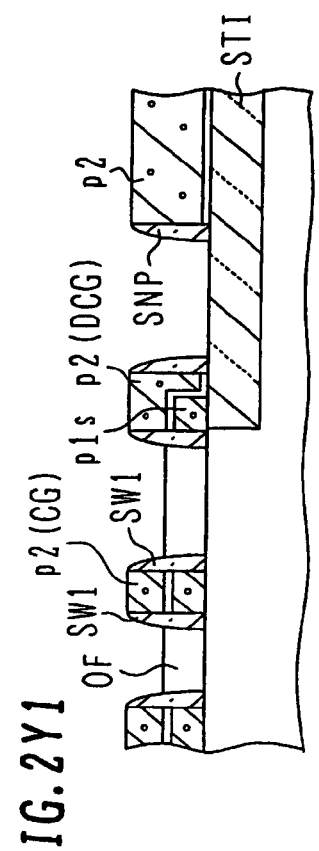
FIG.2X1
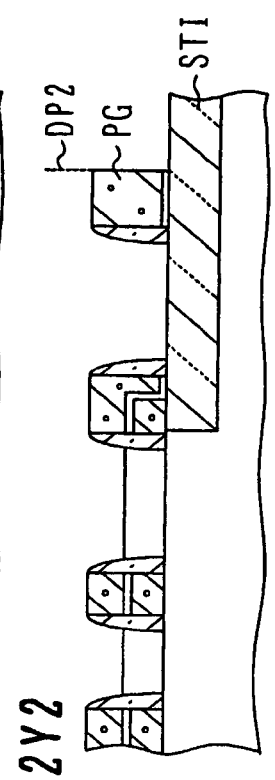
FIG.2X2
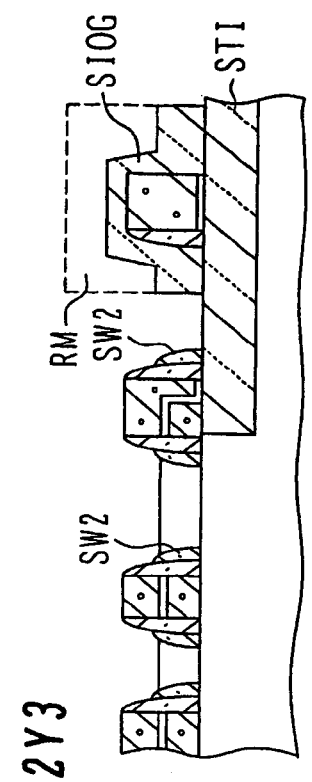
FIG.2X3
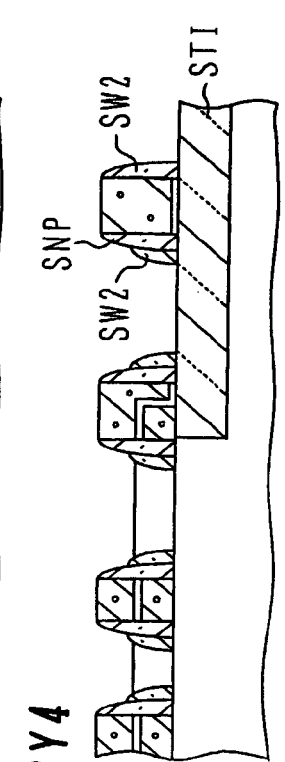
FIG.2X4
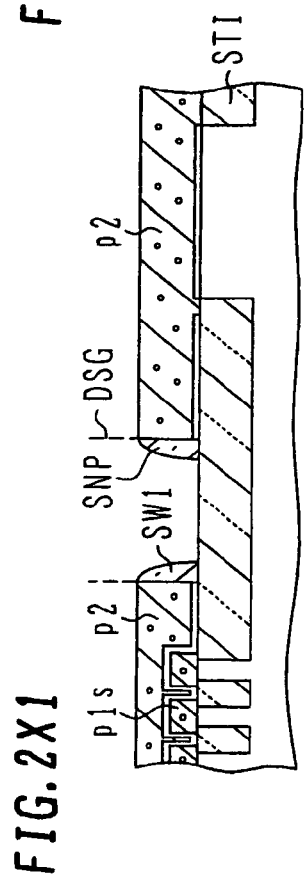
FIG.2Y1
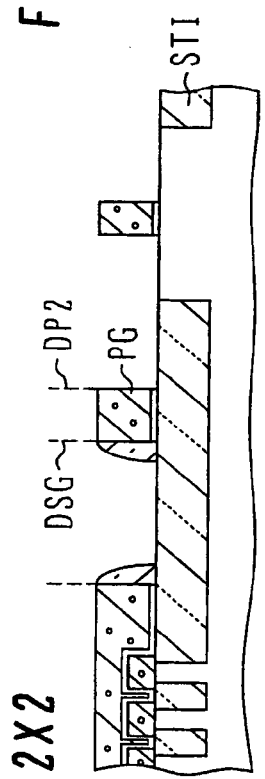
FIG.2Y2
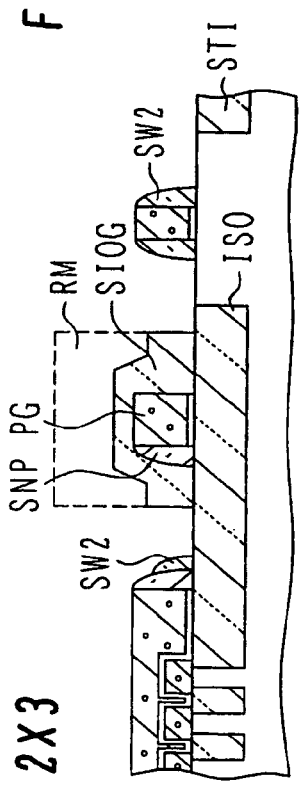
FIG.2Y3
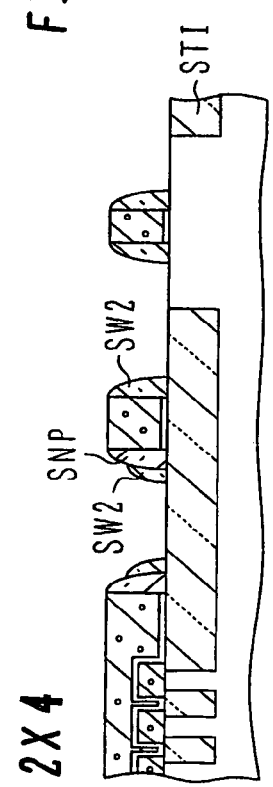
FIG.2Y4

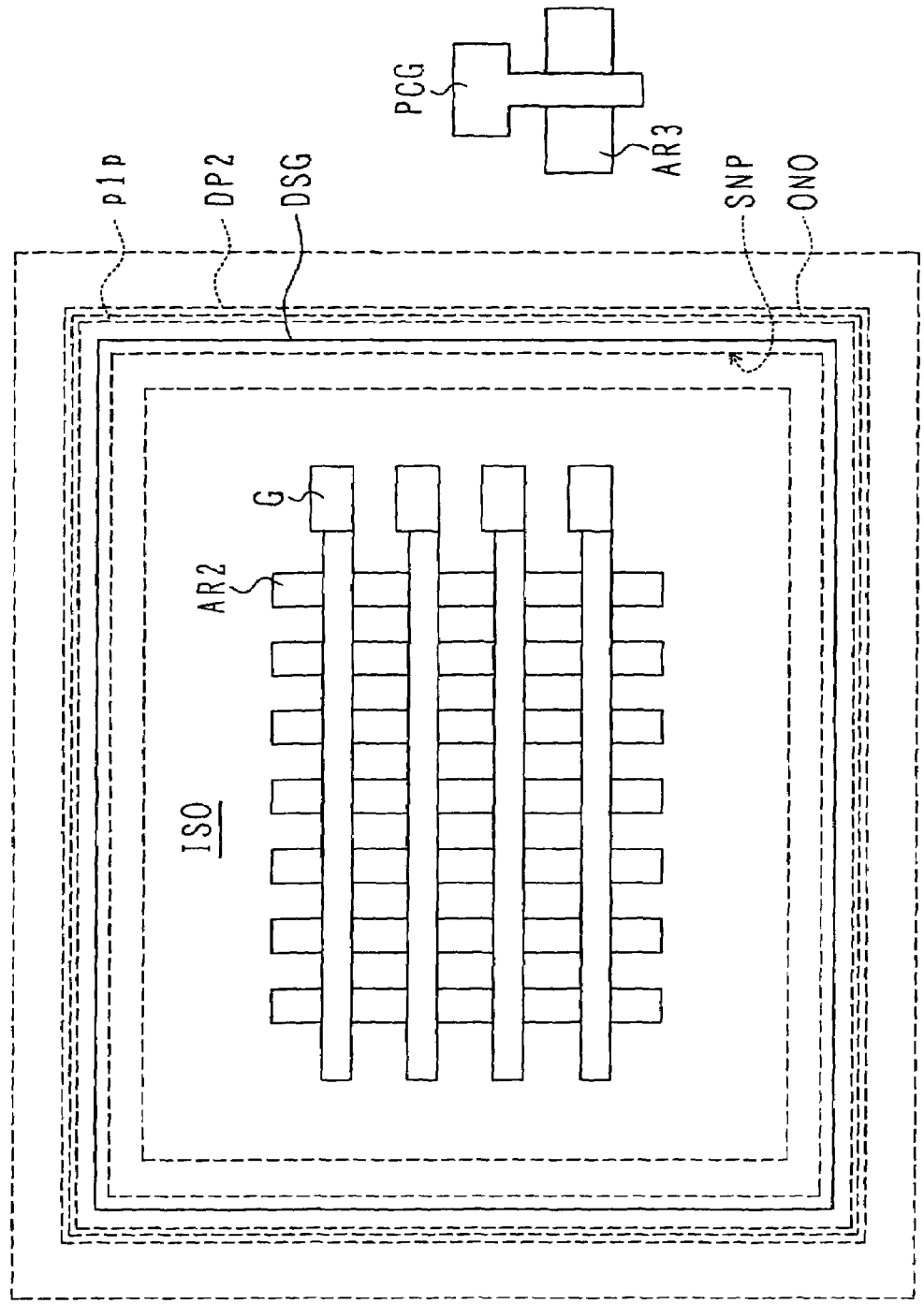

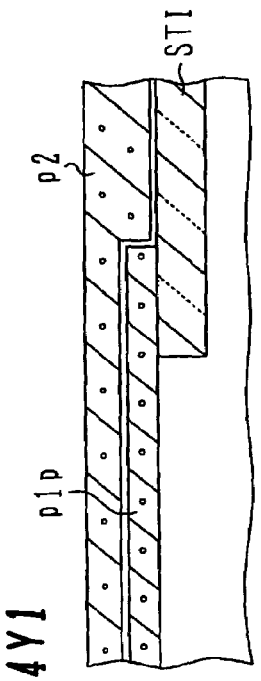
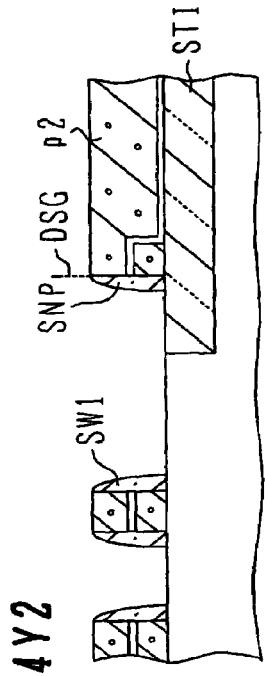
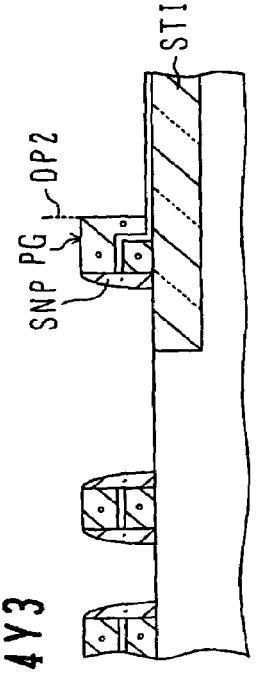
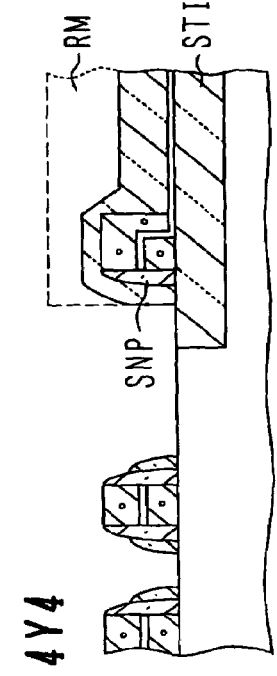
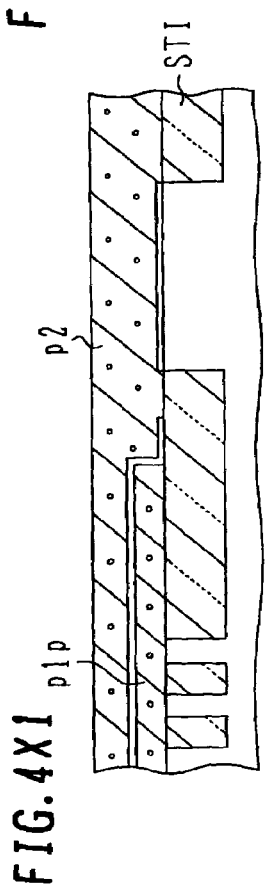
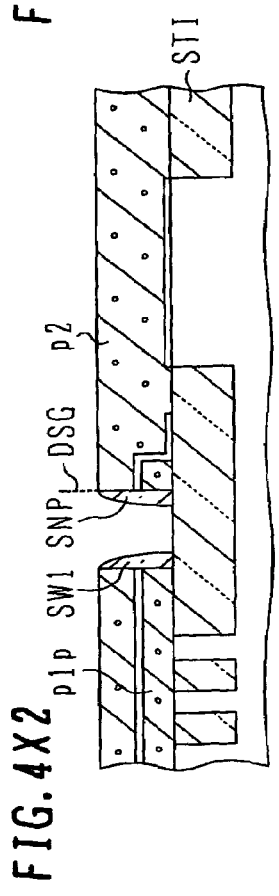
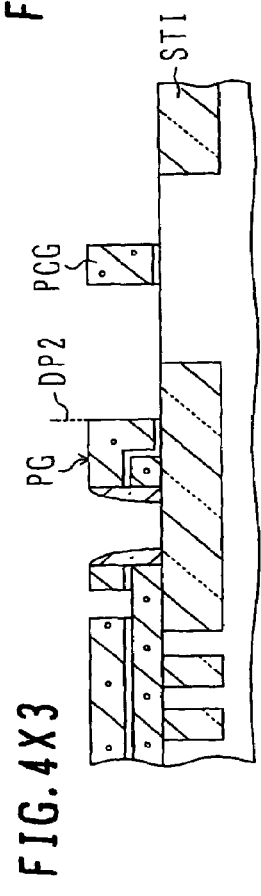
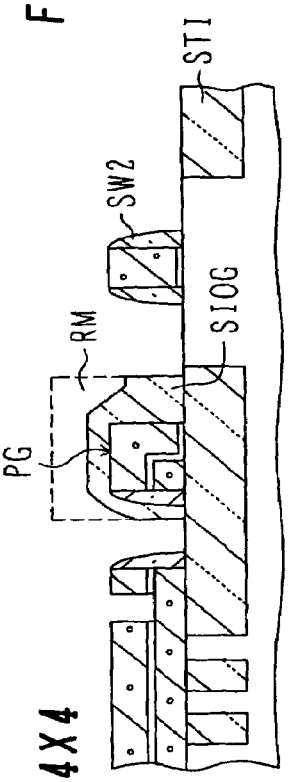

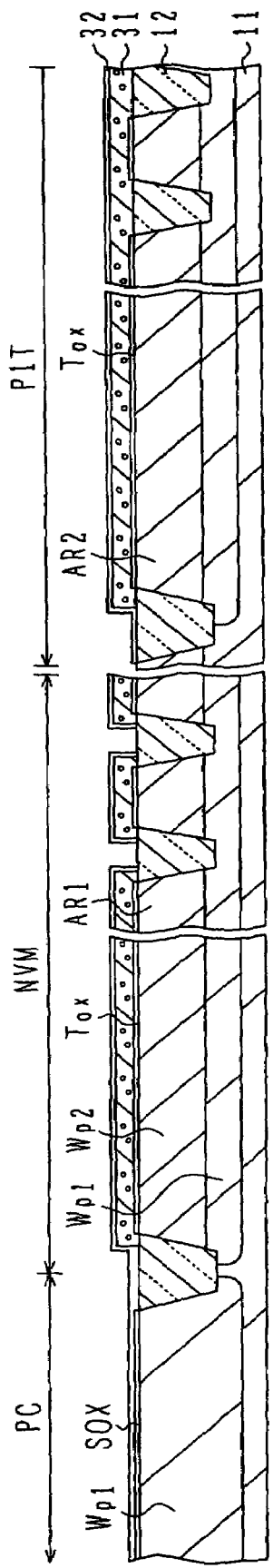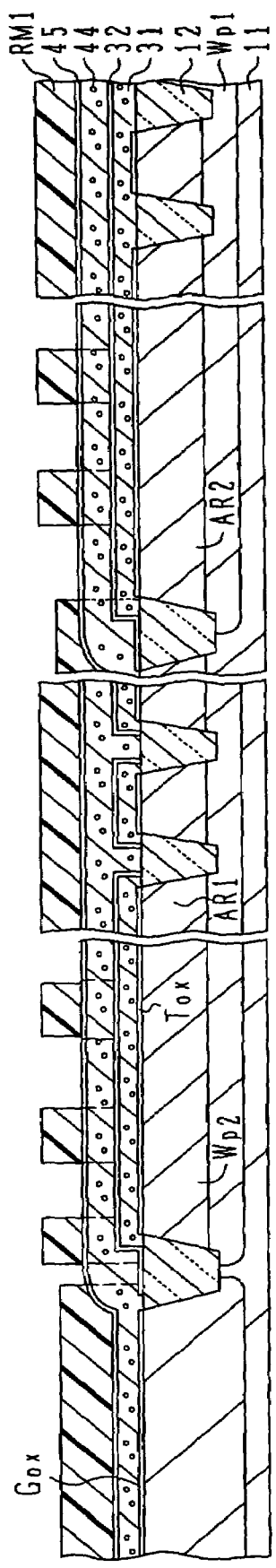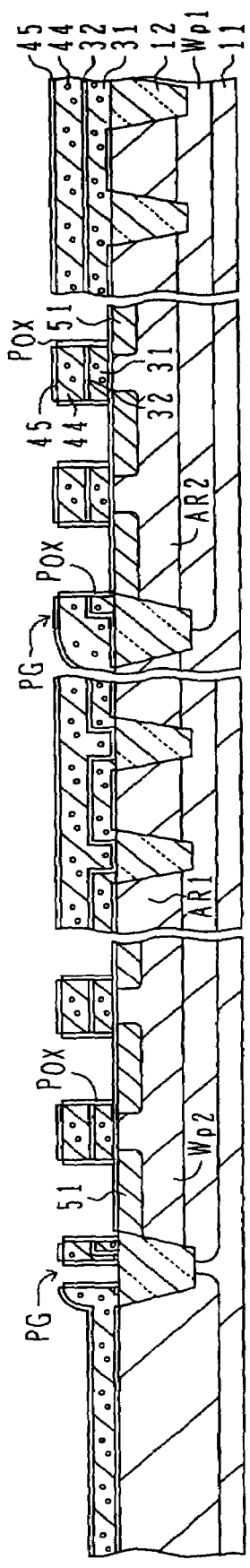

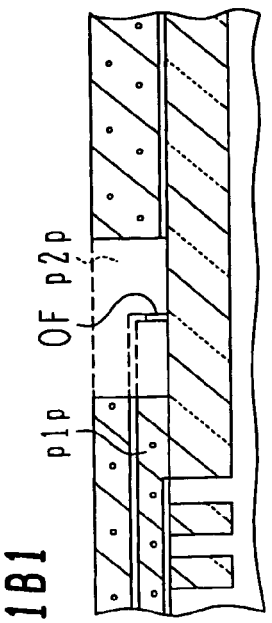
FIG.11A1
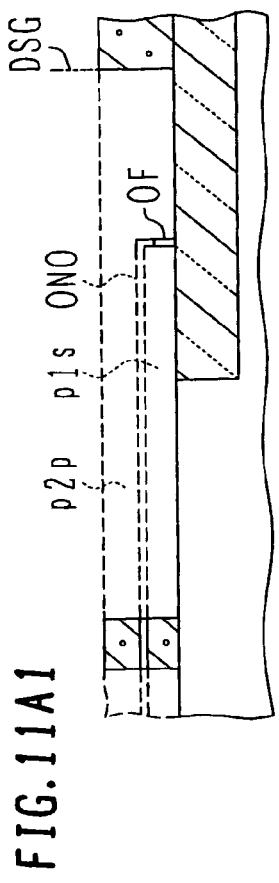
FIG.11B1
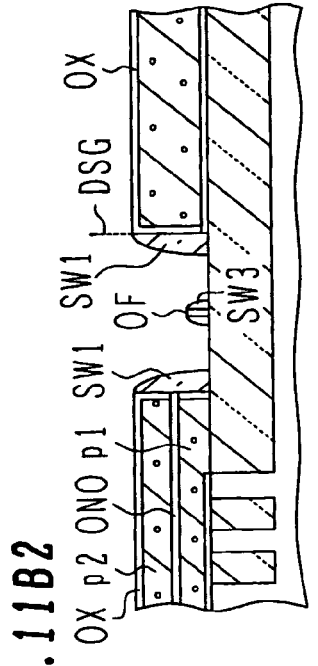
FIG.11A2
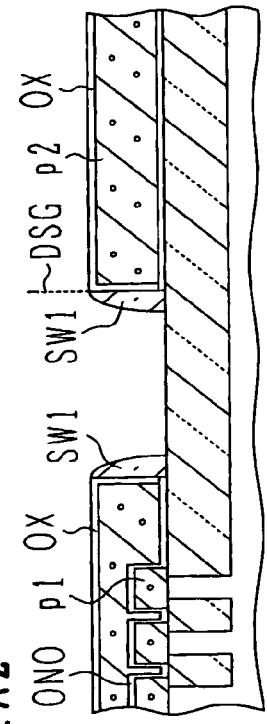
FIG.11B2
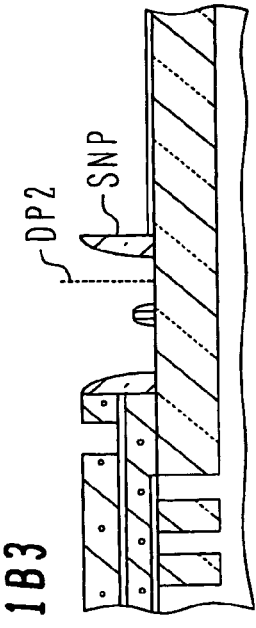
FIG.11A3
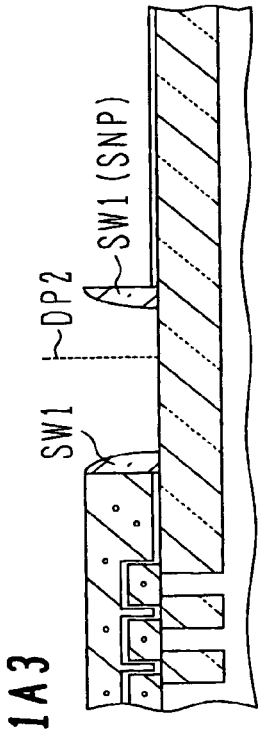
FIG.11B3
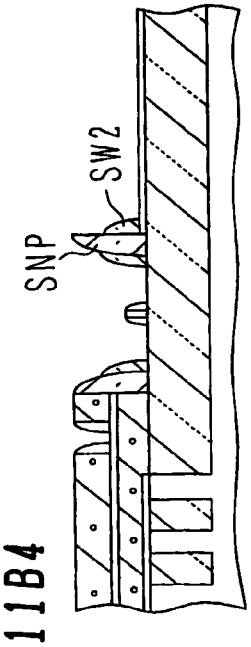
FIG.11A4
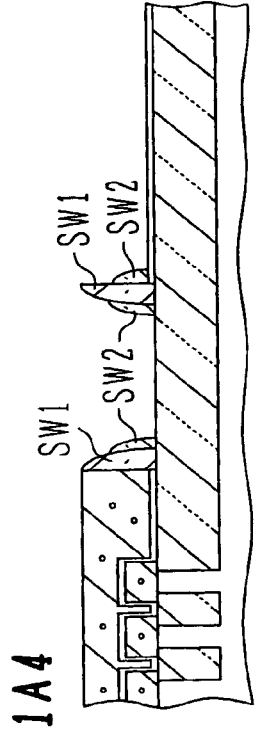
FIG.11B4

US 7,504,688 B2

SEMICONDUCTOR DEVICE WITH INTEGRATED FLASH MEMORY AND PERIPHERAL CIRCUIT AND ITS MANUFACTURE METHOD

CROSS REFERENCE TO RELATED APPLICATION

This application is based on and claims priority of Japanese Patent Application No. 2005-100459 filed on Mar. 31, 2005, the entire contents of which are incorporated herein by reference.

BACKGROUND OF THE INVENTION

A) Field of the Invention

The present invention relates to a semiconductor device and its manufacture method, and more particularly to a semiconductor device having a non-volatile memory of a stacked gate electrode structure formed on a gate insulating film (a tunneling insulating film) on the surface of a semiconductor substrate and to its manufacture method. The stacked gate electrode structure is constituted of a floating gate electrode (typically a polysilicon layer), an inter-electrode insulating film (typically an ONO stacked insulating film of an oxide film/a nitride film/an oxide film) and a control gate (typically a polysilicon layer).

B) Description of the Related Art

Many non-volatile semiconductor memories such as flash memories are used which utilize two-layer polysilicon layers. A flash memory is formed by forming a tunneling oxide film on a silicon substrate, forming a floating gate of a first polysilicon layer on the tunneling oxide film, and forming a control gate of a second polysilicon layer with an inter-electrode insulating film being interposed therebetween. An ONO film of a lamination of an oxide film/a nitride film/an oxide film is used as the inter-electrode insulating film. By applying a voltage between the control gate and substrate, it is possible to inject (write) charges from the substrate to the floating gate and to drain (erase) charges in the floating gate to the substrate.

The floating gate is formed independently in each memory cell. A control gate is used in common by a plurality of memory cells. For electric insulation between the control gate and floating gate, the ONO film covers the upper surface and side wall of the floating gate covered with the control gate.

In an integrated peripheral circuit area, the first polysilicon layer is removed and a single-layer gate electrode is formed by the second polysilicon layer. In a flash memory, unique processes such as side wall oxidation are executed after the laminated gate electrodes are formed. If these unique processes are executed after the gate electrodes of transistors in the peripheral circuit area are patterned, undesired issues occur such as generation of bird's beaks due to side wall oxidation so that the performance of transistors is degraded. To avoid this, during a process of forming laminated gate electrodes of flash memories, the second polysilicon layer is not patterned but left.

A flash memory can function as a MOS transistor by connecting a wiring to the floating gate of a flash memory. A transistor can be formed by using flash memory manufacture processes. This transistor is called first polysilicon transistor.

In order to form an electrically insulated floating gate of a flash memory, first, first polysilicon layers covering the active regions are formed in a parallel stripe shape and covered with an ONO film. After the ONO film is patterned, a second polysilicon layer is deposited on the whole substrate surface. By disposing a control gate mask pattern crossing parallel stripes of the first polysilicon layers, the second polysilicon layers, ONO films and first polysilicon layers are etched to form laminated electrodes.

Most of manufacture processes are used in common in the flash memory area and first polysilicon transistor area, separately from the peripheral circuit area using single-layer gate electrodes. Although the second polysilicon layer is formed secondarily in a first polysilicon transistor area, this layer is not necessary in terms of electric sense. The first and second polysilicon layers may be patterned in the same shape. The first polysilicon layer is left in the first polysilicon transistor area and removed in its peripheral area. The peripheral edge of the first polysilicon layer extends outside the first polysilicon transistor area. The ONO film is formed on the upper surface and peripheral side wall of the first polysilicon layer.

The second polysilicon layer is formed thereafter. By masking out the peripheral circuit area, the second polysilicon layer, ONO film and first polysilicon layer in the flash memory area and first polysilicon transistor area are etched to form laminated gate electrodes. It is difficult to completely remove the ONO film on the peripheral side wall of the first polysilicon layer.

After the side walls of the laminated gate electrodes are thermally oxidized, a silicon nitride film is deposited on the whole substrate surface, and side wall spacers are formed on the side walls of the laminated gate electrodes by reactive ion etching (RIE). Side walls are also formed on the peripheral side walls of the second polysilicon layer covering the peripheral circuit area. Thereafter, the second polysilicon layer in the peripheral circuit area is etched. It is not easy to completely remove the peripheral side wall of the second polysilicon layer.

The second polysilicon layer is patterned by different processes for the laminated gate electrode area (flash memory area+first polysilicon transistor area) and for the peripheral circuit area. As described above, residues are likely to be formed in the border area between the laminated gate electrode area and single-layer gate electrode layer. Residues are easy to be peeled off, forming dusts.

Description will be made by referring to the accompanying drawings. FIGS. 10A and 10B are a partial plan view of a flash memory area adjacent to a peripheral circuit area and a partial plan view of a first polysilicon transistor area adjacent to the peripheral circuit area. FIGS. 11A1 to 11A4 and FIGS. 11B1 to 11B4 are cross sectional views showing the structures of the flash memory area and first polysilicon transistor area during manufacture processes.

As shown in FIGS. 10A and 10B, in the flash memory area and first polysilicon transistor area, a plurality of active regions AR long in vertical direction are defined in parallel and surrounded by an isolation region ISO. In the flash memory area, a plurality of first polysilicon layers p1s are patterned in stripe shape, being mutually separated and covering each active region AR. In the first polysilicon transistor area, the first polysilicon layer p1s is patterned in a single plain shape covering the whole area as shown by a broken line p1p. A laminated insulating layer ONO of an oxide film/a nitride film/an oxide film is formed covering the first polysilicon layer p1 (p1s and p1p are collectively represented by p1). The laminated insulating layer ONO has a large height on the side wall of the first polysilicon layer p1.

A second polysilicon layer p2p is formed above the whole substrate surface, covering the first polysilicon layer p1 and upper laminated insulating layer ONO. In the area inner than a border line DSG, the second polysilicon layer p2p, and the underlying laminated insulating layer ONO and first polysilicon layer p1 are etched in a shape of the control gate electrode CG and gate electrode G by using the same mask. In the area outer than the border line DSG, the whole polysilicon layer is left. Since the laminated insulating layer ONO has a large height at the peripheral side wall of the first polysilicon layer, etching residues are formed.

FIG. 11A1 is a cross sectional view along a direction of the active region AR in the flash memory area shown in FIG. 10A. FIG. 11B1 is a cross sectional view along a direction of the laminated gate electrode G in the first polysilicon transistor area shown in FIG. 10B. Although the flat second polysilicon layer p2, laminated insulating layer ONO and first polysilicon layer p1 are etched, the laminated insulating layer ONO on the peripheral side wall of the first polysilicon layer p1 is left, forming an ONO fence OF. The ONO fence OF between the control gate electrodes CG is hard to be peeled off because the distance between the control gate electrodes CG is short as shown in FIG. 10A. In the lower area of FIG. 10A, an elongated U-character shaped ONO fence OF is formed and is easy to be peeled off. The ONO fence at the peripheral side wall of the first polysilicon transistor area has no support as shown in FIG. 10B and is extremely long so that it is very easy to be peeled off.

FIGS. 11A2 and 11B2 are cross sectional views along the direction of the laminated gate electrodes CG and G in the flash memory area and first polysilicon transistor area. The side wall of the laminated gate electrode (including a region of only the second polysilicon layer p2 in the flash memory area) is oxidized, and after ion implantation, the side wall of the laminated gate electrode is oxidized again. The oxide film ox is shown in FIGS. 11A2 and 11B2, but will be omitted for simplicity in other figures. Thereafter, a silicon nitride layer is deposited and anisotropic etching is performed to form a side wall SW1 of silicon nitride on the side wall of the laminated gate electrode. A side wall SW1 is also formed on the side wall of the second polysilicon layer in the peripheral circuit area. Side walls SW3 are formed on the side walls of the ONO fence OF. Even in this state, it cannot be said that the strength of the ONO fence is sufficient. After the laminated gate electrode structure is formed in the laminated gate area, single-layer gate electrodes are formed in the peripheral circuit area.

With reference to FIGS. 10A and 10B, the area inner than a border line DP2 is covered with a resist mask, and the second polysilicon layer p2 in the peripheral circuit area outer than the border line DP2 is patterned to form gate electrodes of the peripheral circuit. An unnecessary second polysilicon layer p2 is etched and removed.

As shown in FIGS. 11A3 and 11B3, the side wall SW1 of silicon nitride formed on the peripheral side wall of the second polysilicon layer p2 in the peripheral circuit area loses the support of the second polysilicon layer, forming a silicon nitride pillar SNP in a wall shape (a pillar shape in cross section).

By using a resist mask, contact holes are formed thorough the second polysilicon layer and laminated insulating layer ONO of the first polysilicon transistor to expose the first polysilicon layer. In the peripheral circuit area, impurity ion implantation is performed on both side of the gate electrode, a silicon oxide layer is deposited, and RIE is performed to form side walls of silicon oxide.

As shown in FIGS. 11A4 and 11B4, also in the border area between the flash memory area and first polysilicon transistor area, oxide film side walls SW2 are formed on the already formed nitride film side wall SW1 and side walls of the SiN pillar SNP. Side walls SW2 are formed also on the side walls of the ONO fence OF. Even if the side walls SW2 are formed, the ONO fence OF and SiN pillar SNP are easy to be peeled off, forming dusts and lowering a yield.

Japanese Patent Laid-open Publication No. HEI-10-163456 proposes that while a first polysilicon film is patterned, a peripheral circuit area is covered with the first polysilicon layer, and after an ONO film is formed, the ONO film and first polysilicon film are etched to leave the first polysilicon film in the peripheral area of the peripheral circuit area. The ONO film on the side wall of the first polysilicon film is left together with the first polysilicon film to prevent generation of ONO fence of thin fence shape.

Japanese Patent Laid-open Publication No. 2000-286350 proposes that the end portion of a first polysilicon film is covered with a dummy pattern second polysilicon film to prevent an ONO film on the side wall of the first polysilicon film from being exposed by etching and dusts from being generated.

By covering the end portion of the striped first polysilicon film above the active region in the memory area, with the dummy pattern second polysilicon film, generation of a long ONO fence without support can be prevented, to prevent peeling-off.

SUMMARY OF THE INVENTION

An object of the present invention is to provide a semiconductor device having high reliability non-volatile memories and peripheral circuits.

Another object of the present invention is to provide a semiconductor device having non-volatile memories and peripheral circuits capable of improving a yield of manufacture processes.

Still another object of the present invention is to provide a manufacture method for a semiconductor device including non-volatile memories capable of improving yield.

According to one aspect of the present invention, there is provided a non-volatile semiconductor memory device comprising: a semiconductor substrate; a non-volatile memory area including a non-volatile memory cell having a gate electrode including a floating gate, an inter-electrode insulating film and a control gate stacked above said semiconductor substrate and having first insulating side walls formed on side walls of said gate electrode; a peripheral circuit area including a transistor having a single-layer gate electrode formed above said semiconductor substrate, said single-layer gate electrode being made of a same layer as a layer of said control gate; and a first border area including: a first isolation region formed in said semiconductor substrate for isolating said non-volatile memory area and said peripheral circuit area; a first conductive pattern including a portion made of a same layer as the layer of said control gate and formed above said semiconductor substrate including said first isolation region; and a first redundant insulating side wall made of a same layer as a layer of said first insulating side wall and formed on a side wall of said first conductive pattern on a side of said non-volatile memory area.

According to another aspect of the present invention, there is provided a manufacture method for a non-volatile semiconductor memory device, comprising the steps of: (a) forming an isolation region in a semiconductor substrate to define a non-volatile memory area including a plurality of stripe shaped first active regions and a peripheral circuit area including second active regions; (b) forming first electrode layers above said first active regions, each of said first electrode layers having such a shape that said first electrode layers cover said first active regions, extend above said isolation region, are separated from each other and do not reach said peripheral circuit area, and forming an inter-electrode insulating film having such a shape that said inter-electrode insulating film covers said first electrode layer and do not reach said peripheral circuit area; (c) forming a second electrode layer above a whole surface of said semiconductor substrate, said second electrode layer covering said inter-electrode insulating film; (d) patterning said second electrode layer, said inter-electrode insulating film and said first electrode layer in said non-volatile memory area to form gate electrodes having such a shape that said control gates traverse intermediate areas of said first active regions, while completely leaving said second electrode layer in said peripheral circuit area; (e) forming first insulating side walls on side walls of said gate electrode in said non-volatile memory area and forming a first redundant insulating side wall on a side wall of said second electrode layer in said peripheral circuit area; and (f) patterning said second electrode layer in said peripheral circuit area to form single-layer gate electrodes and leaving said second electrode layer adjacent to said first redundant insulating side wall.

When the side walls are formed on the side walls of a laminated gate electrode in the non-volatile memory area, redundant side walls are also formed on a control gate electrode layer (second electrode layer) before patterning in the peripheral area. Not by etching the control gate electrode layer adjacent to the redundant side wall, it is possible to suppress the redundant side wall from being peeled or scraped off.

BRIEF DESCRIPTION OF THE DRAWINGS

FIGS. 2X1 to 2X4 and FIGS. 2Y1 to 2Y4 are cross sectional views illustrating the manufacture processes for the structure shown in FIG. 1 and its modification.

FIG. 3 is a schematic plan view of a first polysilicon transistor area of a semiconductor device according to an embodiment of the present invention.

FIGS. 4X1 to 4X4 and FIGS. 4Y1 to 4Y4 are cross sectional views illustrating the manufacture processes for the structure shown in FIG. 3.

FIGS. 9A to 9H are cross sectional views illustrating the manufacture processes for the semiconductor device shown in FIG. 8.

FIGS. 11A1 to 11A4 and FIGS. 11B1 to 11B4 are cross sectional views illustrating the manufacture processes for the structures shown in FIGS. 10A and 10B.

DESCRIPTION OF THE PREFERRED EMBODIMENTS

Embodiments of the present invention will be described.

Figure 1:
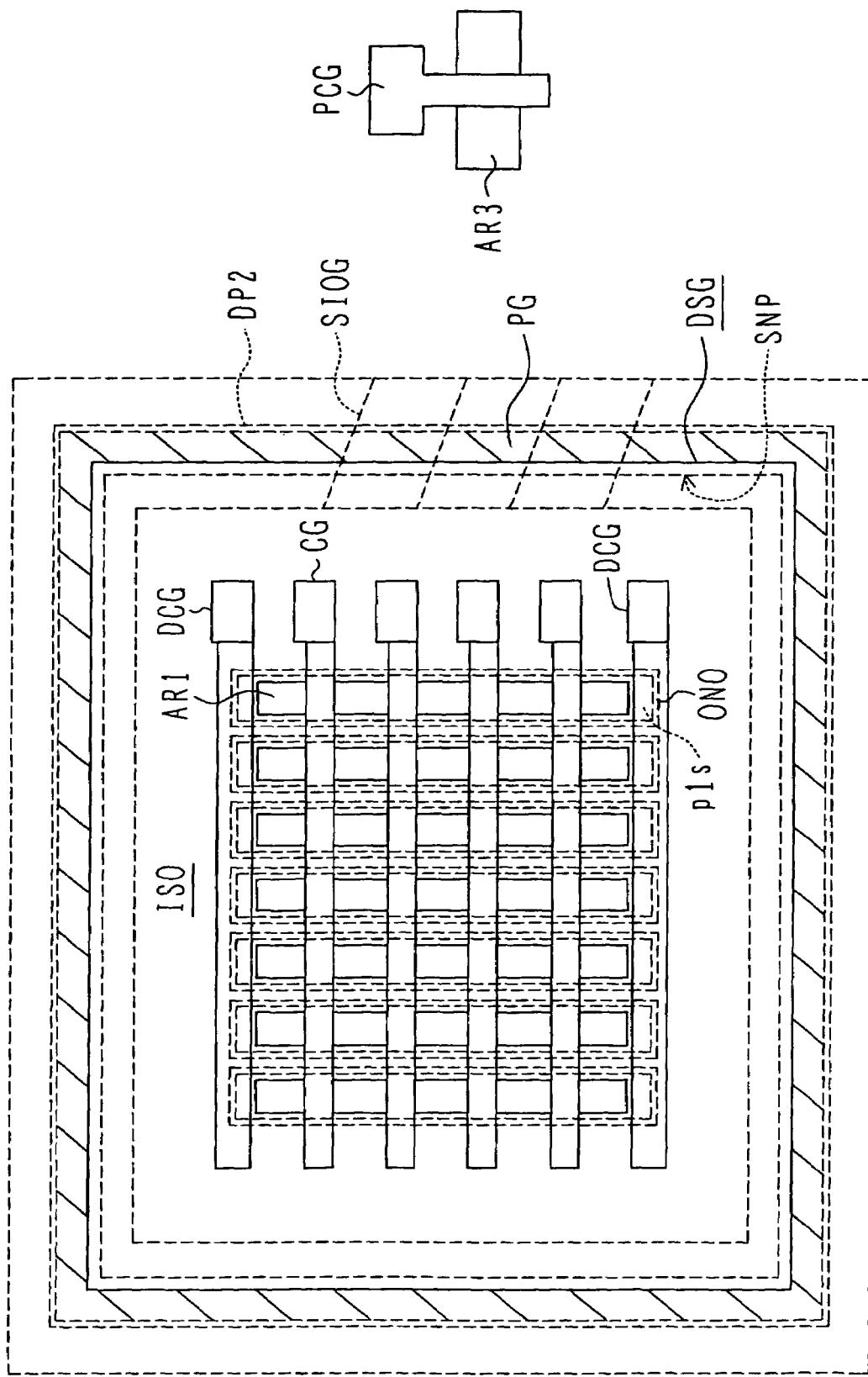
FIG. 1 is a schematic plan view of a non-volatile memory area of a semiconductor device according to an embodiment of the present invention.

FIG. 1 is a plan view of a flash memory area and a peripheral circuit area. FIGS. 2X1 to 2X4 are cross sectional views along a word line (CG) shown in FIG. 1 and FIGS. 2Y1 to 2Y4 are cross sectional views along an active region AR1 shown in FIG. 1.

In the flash memory area, a plurality of active regions AR1 long in vertical direction are defined in parallel and surrounded by an isolation region ISO. On the right side in FIG. 1, an active region AR3 is defined in the peripheral circuit area. A first polysilicon layer is deposited above a semiconductor substrate through a gate insulating film. In the flash memory area, the first polysilicon layer is patterned into first polysilicon layers p1s in striped shape covering active regions AR, and in the peripheral circuit area, the first polysilicon layer is completely removed. A laminated insulating layer ONO of an oxide film/a nitride film/an oxide film is formed and patterned, covering the first polysilicon layers p1s. The laminated insulating layer ONO is removed in the peripheral circuit area. The laminated insulating film ONO has a large height on the side walls of the first polysilicon layers p1s.

A second polysilicon layer p2p is formed on the substrate whole surface, covering the first polysilicon layers p1 and the laminated ONO films ONO thereon. A resist mask is formed having a shape covering the whole second polysilicon layer in an outer area than a line DSG and a shape of control gate electrodes CG and dummy control gate DCG in an inner area than the line DSG. By using this resist mask as an etching mask, the second polysilicon layer p2, laminated insulating layer ONO and first polysilicon layer p1s are etched. The dummy control gates DCG are disposed covering opposite end portions of the striped first polysilicon layers p1s. Although etching residues of the laminated insulating layer ONO are formed on the side wall of the first polysilicon layer exposed only between adjacent gate patterns including the dummy control gates, a length of each etching residue is short.

FIGS. 2X1 and 2Y1 are cross sectional views along a word line direction and an active region direction, respectively. The side walls of the laminated gate electrode are thermally oxidized, impurity ions are implanted, the side walls of the laminated gate electrode is again thermally oxidized, and thereafter side walls SW1 of silicon nitride are formed on the side walls of the laminated gate electrodes CG and DCG. A silicon nitride pillar SNP having the same shape as that of the side walls is formed on the side wall of the second polysilicon layer p2 left in a peripheral area. FIG. 2X1 shows the silicon nitride pillar SNP formed on the peripheral side wall of the second polysilicon layer p2 in the peripheral circuit area. FIG. 2Y1 shows the silicon nitride pillar SNP and also the dummy control gate electrode DCG formed above an upper end portion of the first polysilicon layer p1s covering the active region in the flash memory area. FIG. 2Y1 also shows the ONO fences OF left between gate patterns.

As shown in FIGS. 2X2 and 2Y2, patterning for gate electrodes PCG in the peripheral circuit area is performed. A gate electrode patterning mask has a gate electrode pattern in the peripheral circuit area, and in the flash memory area, covers the area inner than a line DP2 shown in FIG. 1. The line DP2 is set on the outer side of the border line DSG to cover the silicon nitride pillar SNP with the mask. The silicon nitride pillar SNP is supported on the side wall of a guard PG of the left second polysilicon layer so that it is hard to be peeled off.

As shown in FIGS. 2X3 and 2Y3, side walls SW2 are formed on the gate electrode in the peripheral circuit area. A silicon oxide film is deposited and anisotropically etched by reactive ion etching (RIE). In this case, a resist mask RM is used covering an area including at least a partial area of the second polysilicon guard PG continuous with the silicon nitride pillar SNP.

In FIGS. 2X3 and 2Y3, the resist mask RM is shown which completely covers the polysilicon guard PG. A silicon oxide guard SIOG is therefore left, covering the silicon nitride pillar SNP and polysilicon guard PG. If the resist mask RM exposes the right side of the polysilicon guard PG, a side wall SW2 is formed on the right side wall of the polysilicon guard PG. In either case, the silicon nitride pillar SNP is firmly supported by the left polysilicon guard PG and upper silicon oxide guard SIOG. If the silicon nitride pillar SNP is not necessary to be guarded to such a degree, the structure may be simplified slightly.

As shown in FIGS. 2X4 and 2Y4, the resist mask RM may be omitted and RIE is performed for the silicon oxide film. Silicon oxide side walls SW2 are formed on the outer walls of the polysilicon guard PG and silicon nitride pillar SNP. The number of masks can be reduced by one although the peel-off preventive ability of the silicon nitride pillar is lowered slightly.

FIG. 3 is a plan view showing a first polysilicon transistor area and the peripheral circuit area. FIGS. 4X1 to 4X4 are cross sectional views along the word line (G) shown in FIG. 3, and FIGS. 4Y1 to 4Y4 are cross sectional views along the active region AR2 shown in FIG. 3.

In the first polysilicon transistor area, a plurality of active regions AR2 long in vertical direction are defined in parallel and surrounded by an isolation region ISO. On the right side in FIG. 3, an active region AR3 is defined in the peripheral circuit area. A first polysilicon layer is deposited. In the first polysilicon transistor area, the first polysilicon layer is patterned into a rectangular first polysilicon layer p1p covering the whole first polysilicon transistor area, and in the peripheral circuit area, the first polysilicon layer is completely removed.

No pattern is formed in the first polysilicon transistor area, which is different from the flash memory area. Other points are similar to the flash memory area. A laminated insulating layer ONO of an oxide film/a nitride film/an oxide film is formed covering the first polysilicon layers p1p. The laminated insulating film ONO has a large height on the side wall of the rectangular first polysilicon layer p1p covering the first polysilicon transistor area.

As shown in FIGS. 4X1 and 4Y1, a second polysilicon layer p2 is formed on the whole substrate surface, covering the first polysilicon layer p1p and laminated insulating layer ONO formed thereon.

As shown in FIGS. 4X2 and 4Y2, in an area outer than a line DSG, the second polysilicon layer is left and in an area inner than the line DSG, the second polysilicon layer p2, laminated insulated film ONO and first polysilicon layer p1p are etched in a shape of gate electrodes G. The line DSG is set inside the peripheral edge of the first polysilicon layer p1p. The periphery of the first polysilicon layer and the ONO film on the side wall of the first polysilicon in the area outer than the line DSG are accomodated in the second polysilicon layer p2.

As side walls SW1 of silicon nitride are formed on the side walls of laminated gate electrodes G, a silicon nitride pillar SNP is formed on the side wall of the laminated gate electrode (periphery of the first polysilicon layer p1p and second polysilicon layer p2) left in the periphery of the first polysilicon transistor area.

As shown in FIGS. 4X3 and 4Y3, patterning for gate electrodes PCG in the peripheral circuit area is performed. In this case, the first polysilicon transistor area is covered with a mask. The mask has a pattern of the gate electrodes PCG in the peripheral circuit area, and covers the area inner than a line DP2. The line DP2 is set outside the border line DSG shown in FIG. 3.

The mask covers the silicon nitride pillar SNP formed on the inner side of the line DSG. Since the silicon nitride pillar SNP is supported on the side wall of a left laminated polysilicon guard PG, it is hard to be peeled off.

As shown in FIGS. 4X4 and 4Y4, side walls SW2 are formed on the gate electrode in the peripheral circuit area. A silicon oxide film is deposited and anisotropically etched by RIE. In this case, a resist mask RM is used covering an area including at least a partial area of the polysilicon guard PG continuous with the silicon nitride pillar SNP. In FIGS. 4X4 and 4Y4, the resist mask RM is shown which completely covers the polysilicon guard PG. A silicon oxide guard SIOG is therefore left, covering the laminated insulating film ONO on the side wall of the first polysilicon layer, silicon nitride pillar SNP and polysilicon guard PG. The silicon nitride pillar SNP is sandwiched between the polysilicon guard PG and silicon oxide guard SIOG to be firmly supported. If the silicon nitride pillar SNP is not necessary to be guarded to such a degree, the resist mask RM may be omitted as shown in FIGS. 2X4 and 2Y4, and the side wall is formed instead of the silicon oxide guard.

Figure 5A:
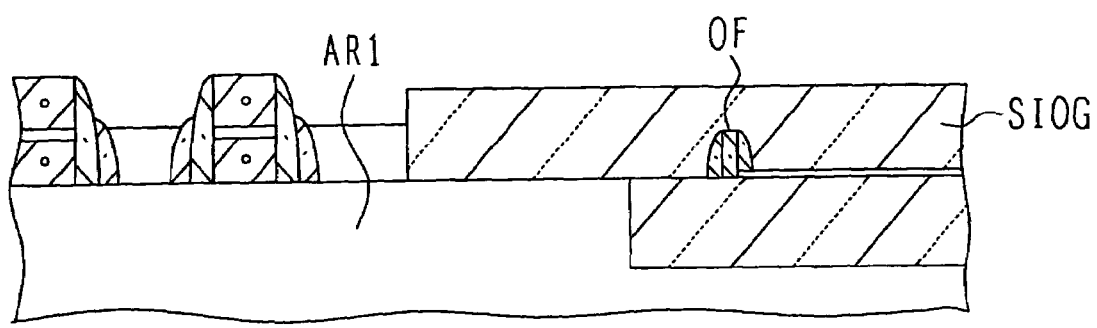
FIGS. 5A and 5B are cross sectional views showing a modification.
Figure 5B:
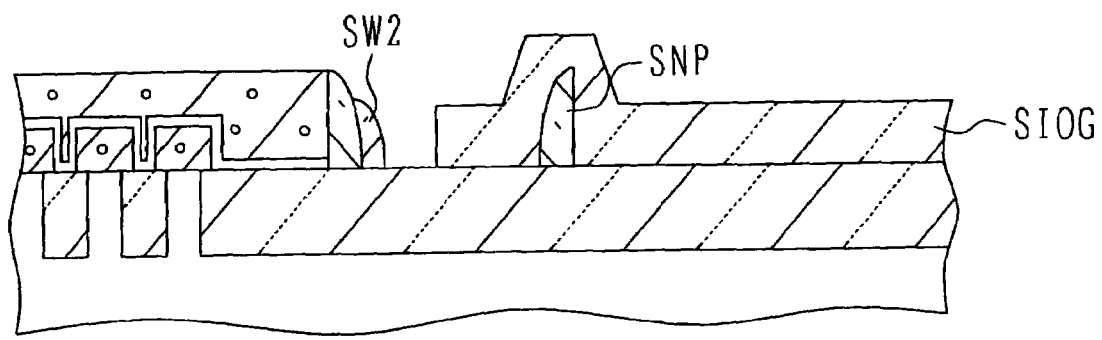

FIGS. 5A and 5B illustrate a modification. In this modification, it is permitted to form an unsupported ONO fence OF and silicon nitride pillar SNP, without forming a second polysilicon guard. When side walls are formed on the gate electrode in the peripheral circuit area, a resist mask for guarding the ONO fence OF and silicon nitride pillar SNP is formed to protect them from RIE.

FIG. 5A is a cross sectional view along the active region AR1 in the flash memory area. A silicon oxide guard SIOG is formed covering the end portion of a U-character shape of an ONO fence OF. Although an ONO fence OF is left between the silicon oxide guard SIOG and the adjacent laminated gate electrode, peeling-off is hard to occur because a length of the left ONO fence OF is short.

FIG. 5B is a cross sectional view along the word line. A silicon nitride pillar SNP on an isolation region STI is covered with a silicon oxide guard SIOG. In this modification, although peeling-off may occur during the period until the silicon oxide guard SIOG guards the ONO fence OF and wall-like silicon nitride pillar SNP, peeling-off is hard to occur after the silicon oxide guard SIOG is formed.

In the following, detailed description will be made on manufacture processes for the structures of the above-described embodiments.

Figure 6:
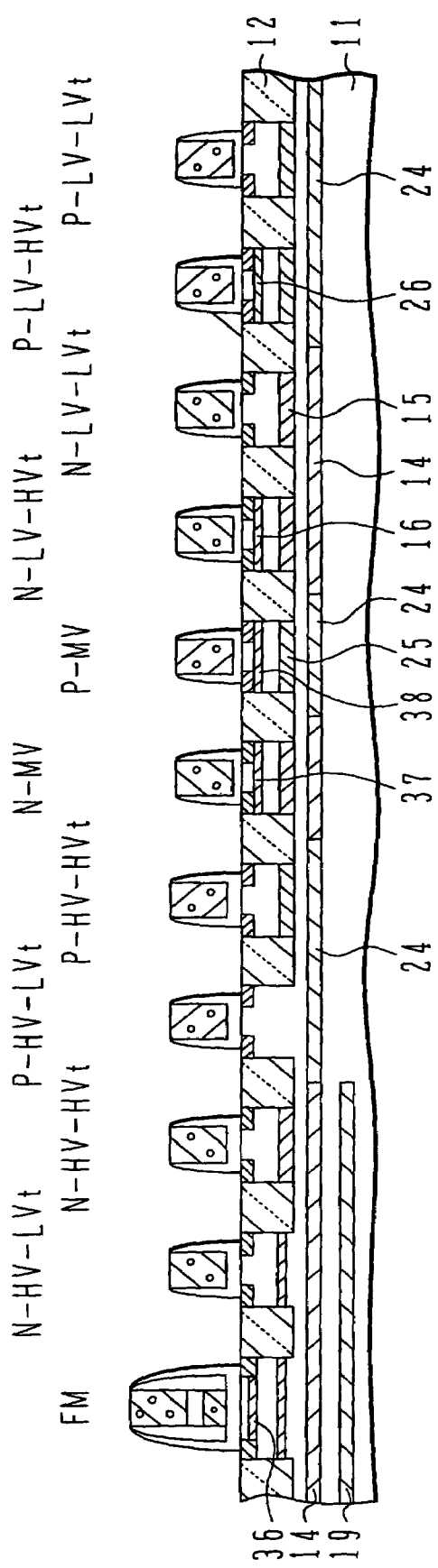
FIG. 6 is a cross sectional view of eleven types of transistors integrated in a semiconductor device.

FIG. 6 shows eleven types of transistors integrated in a semiconductor device. Since a non-volatile memory cell FM and a first polysilicon transistor have generally the same structure, the non-volatile memory cell FM such as a flash memory is used as a representative in the following description. The operation voltages of other transistors include three voltages: a high voltage HV (e.g., 5 V), a middle voltage MV (e.g., 3.3 V) and a low voltage LV (e.g., 1.2 V). Threshold voltages of a high voltage transistor HV and a low voltage transistor LV include two threshold voltages: a high threshold voltage HVt with a low leak current and a low threshold voltage LVt with a high operation speed. These threshold voltages each include for an n-channel N and a p-channel P. A pattern rule is, for example, 0.13 μm. A middle voltage transistor MV is used as an input/output interface. The operation voltage may be 2.5 V, 1.8 V or the like in addition to 3.3 V.

N-channel high voltage transistors and a flash memory cell are formed in a p-type well 14 in an n-type well 19. N-channel transistors are formed in the p-type well 14. P-channel MOS transistors are formed in an n-type well 24. Transistors other than a high breakdown voltage, low threshold value p-channel MOS transistor P-HV-LVt are formed with channel stop regions 15 and 25.

Low voltage, high threshold value transistors N-LV-HVt and P-LV-HVt are formed with threshold value adjusting ion doped regions 16 and 26. Middle voltage transistors N-MV and P-MV are formed with threshold value adjusting ion doped regions 37 and 38. The flash memory FM is formed with a threshold value adjusting ion doped region 36. A threshold value is adjusted through interoperation of the threshold value ion doped region and channel stop region.

In the following, description will be made on the manufacture processes for the semiconductor device shown in FIG. 6.

Figure 7A:
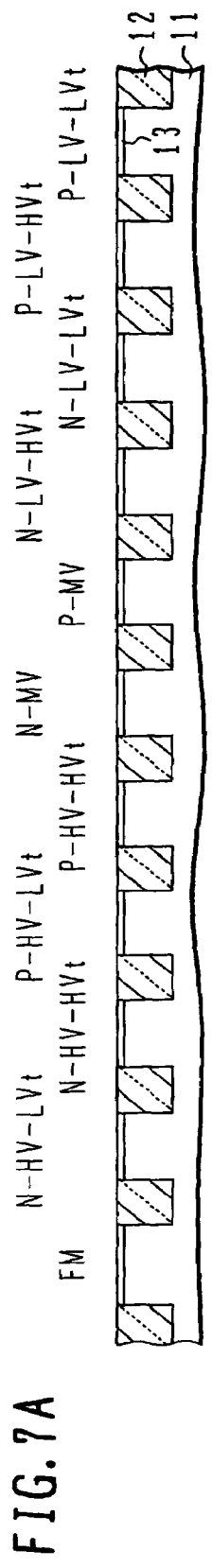
FIGS. 7A to 7S are cross sectional views illustrating the manufacture processes for the structure shown in FIG. 6.

As shown in FIG. 7A, a shallow trench isolation (STI) 12 as an isolation region is formed in a semiconductor substrate 11. The surface of the silicon substrate is thermally oxidized to form a sacrificial silicon oxide film 13 having a thickness of, e.g., 15 nm.

Figure 7B:
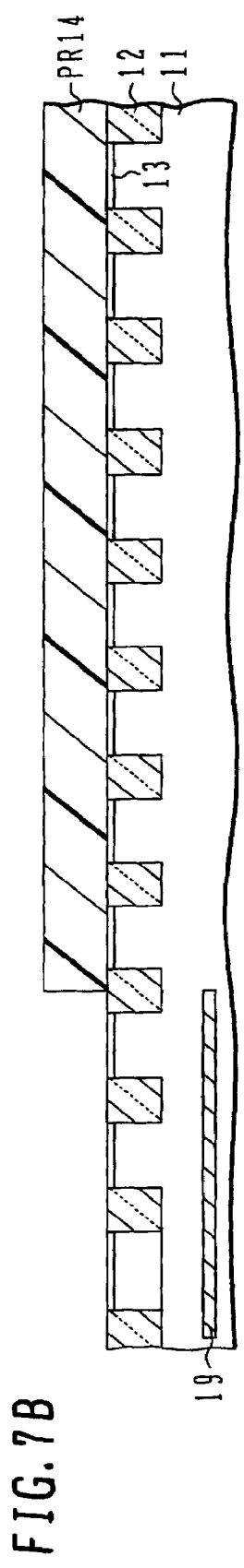

As shown in FIG. 7B, a photoresist mask PR14 is formed exposing the flash memory cell FM and high voltage n-channel MOS transistor N-HV regions, and $P^+$ ions for forming the n-type well 19 are implanted at an acceleration energy of 2 MeV and a dose of $2\times10^{13}$ cm$^{-2}$ (hereinafter written in the form such as 2E13). The resist mask PR14 is thereafter removed.

Figure 7C:
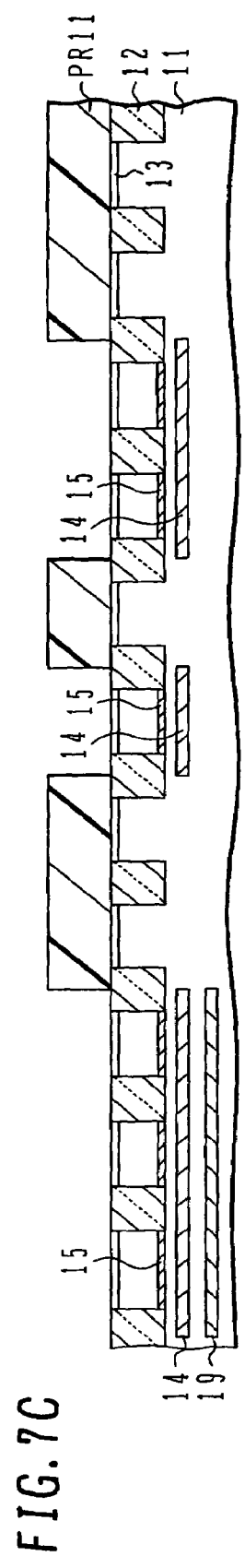

As shown in FIG. 7C, a photoresist mask PR11 is formed having openings exposing the flash memory cell FM and n-channel MOS transistor regions, $B^+$ ions for forming the p-type well 14 are implanted at an acceleration energy of 400 keV and a dose of $1.4\times10^{13}$ cm$^{-2}$ (1.4E13), and $B^+$ ions for forming the channel stop region 15 are implanted at an acceleration energy of 100 keV and a dose of 3.6E12. The resist mask PR 11 is thereafter removed. In this manner, the p-type well 14 and channel stop region 15 are formed.

Figure 7D:
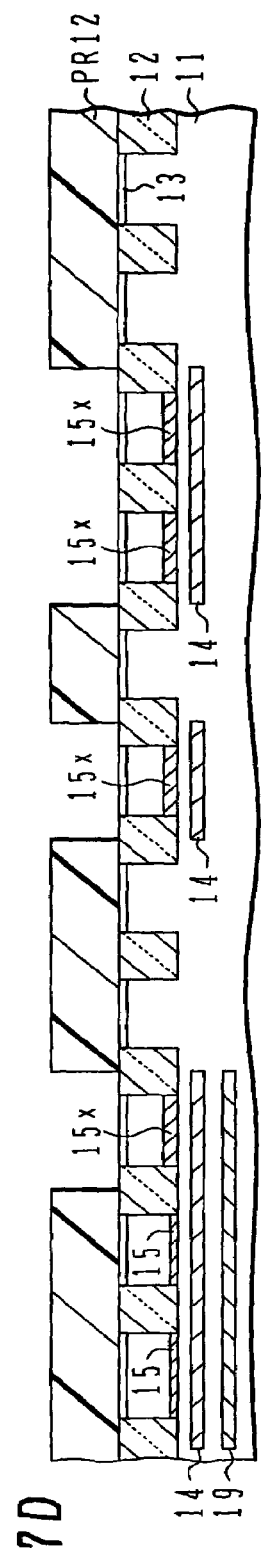

As shown in FIG. 7D, a photoresist mask PR12 is formed exposing the n-channel MOS transistor regions excepting the flash memory FM region and high voltage, low threshold value n-channel MOS transistor N-HV-LVt, and $B^+$ ions for forming the channel stop region are additionally implanted at an acceleration energy of 100 keV and a dose of 4.0E12. A channel stop region 15x additionally implanted with ions is therefore formed. The resist mask PR12 is thereafter removed.

Figure 7E:
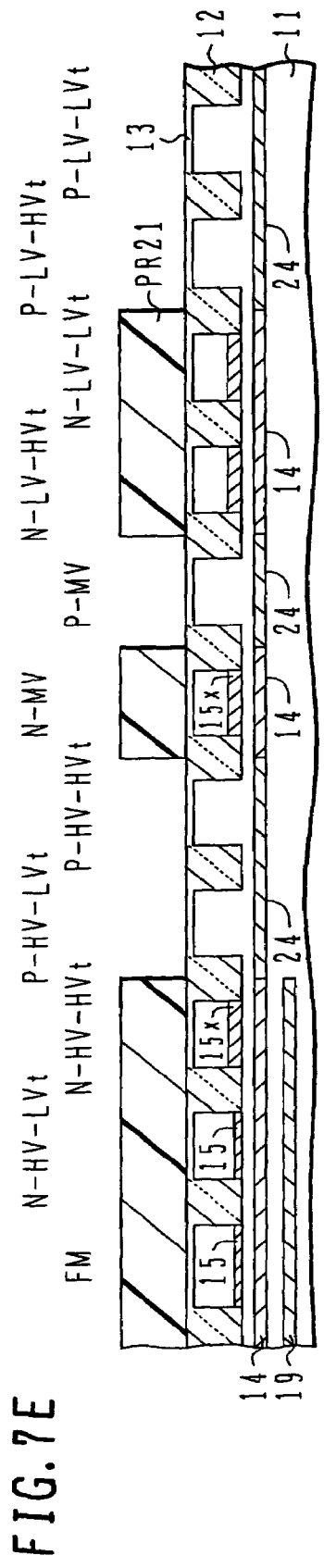

As shown in FIG. 7E, a photoresist mask PR21 is formed exposing the p-channel MOS transistor regions, and $P^+$ ions for forming the n-type well 24 are implanted at an acceleration energy of 600 keV and a dose of 1.5E13, and at an acceleration energy of 240 keV and a dose of 9.0E11. The resist mask PR21 is thereafter removed.

Figure 7F:
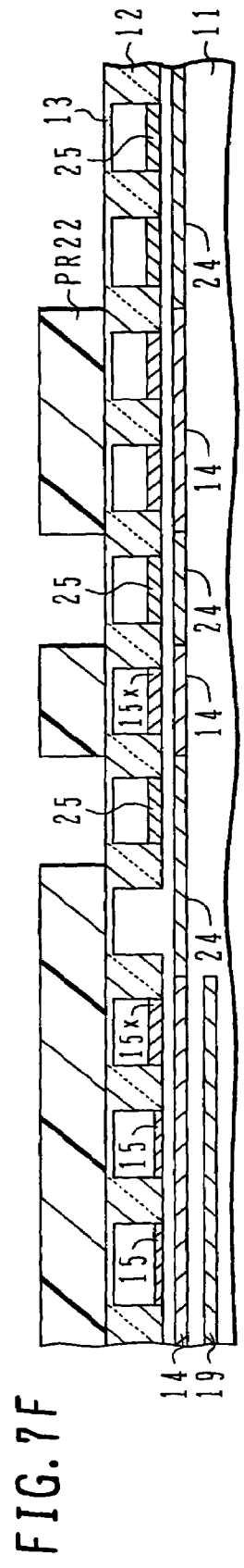

As shown in FIG. 7F, a photoresist mask PR22 is formed exposing the p-channel MOS transistor regions excepting the high voltage, low threshold value transistor regions, and $P^+$ ions for forming the channel stop region 25 are implanted at an acceleration energy of 240 keV and a dose of 3.6E12. The resist mask PR22 is thereafter removed.

Figure 7G:
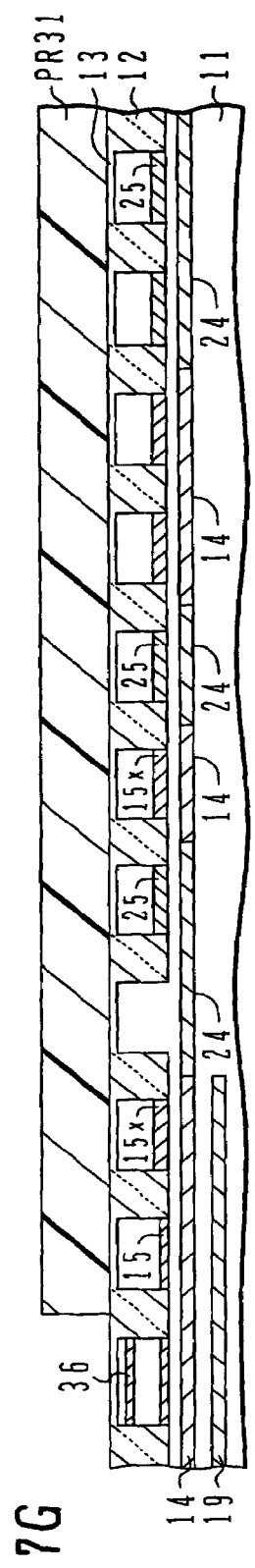

As shown in FIG. 7G, a photoresist mask PR31 is formed exposing the flash memory FM region, and $B^+$ ions for forming the threshold value adjustment region 36 are implanted at an acceleration energy of 40 keV and a dose of 6.0E13. The resist mask PR31 is thereafter removed. The silicon oxide film 13 on the surface of the semiconductor substrate is removed by HF solution to expose silicon surfaces of the active regions.

Figure 7H:
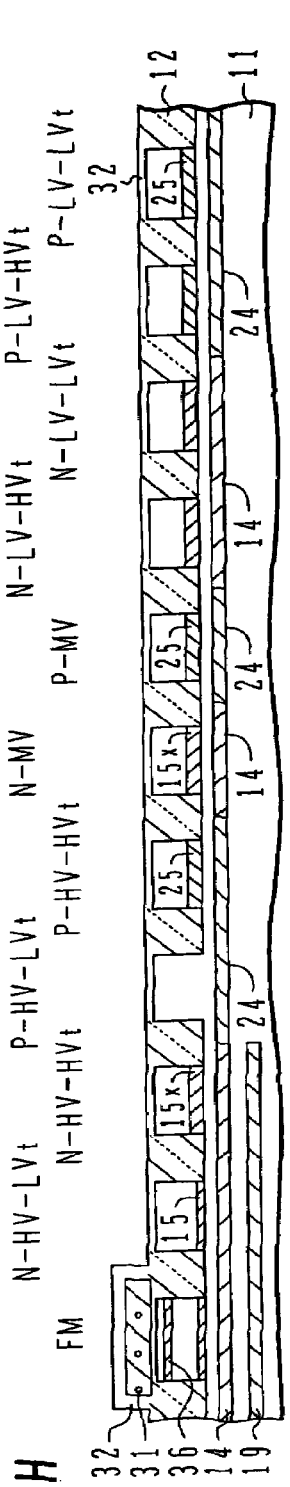

As shown in FIG. 7H, the semiconductor substrate surface is thermally oxidized to grow a tunneling oxide film having a thickness of about 10 nm. On the tunneling oxide film, an amorphous silicon film doped with phosphorus (P) and having a thickness of about 90 nm is deposited and patterned in the shape of a floating gate 31. The amorphous silicon film is transformed into a polysilicon film by later heat treatment.

A silicon oxide film and a silicon nitride film are deposited by CVD to thicknesses of 5 nm and 8 nm, respectively, covering the floating gate 31. The surface of the silicon nitride film is thermally oxidized to form a silicon oxide film having a thickness of about 6 nm. An ONO film 32 is therefore formed.

Figure 7I:
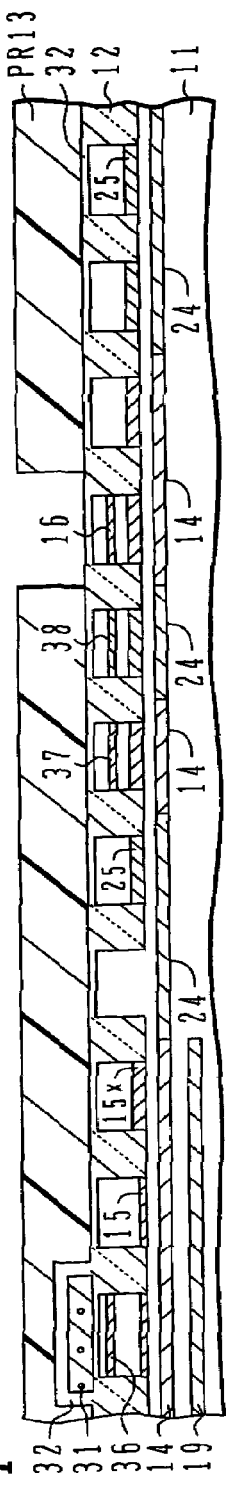

As shown in FIG. 7I, a photoresist mask PR13 is formed exposing the low voltage, high threshold value n-channel transistor N-LV-HVt region, and $B^+$ ions for forming the threshold value adjusting region 16 are implanted at an acceleration energy of 15 keV and a dose of 7.0E12. The resist mask PR13 is thereafter removed.

Figure 7J:
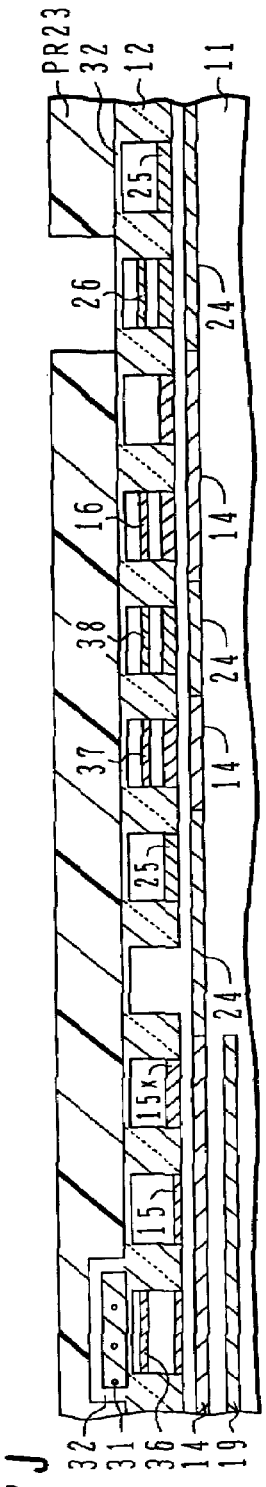

As shown in FIG. 7J, a photoresist mask PR23 is formed exposing the low voltage, high threshold value p-channel transistor P-LV-HVt region, and $As^+$ ions for forming the threshold value adjusting region 26 are implanted at an acceleration energy of 150 keV and a dose of 6.0E12. The resist mask PR23 is thereafter removed.

Pocket region forming ion implantation may be performed for low voltage transistors by using an extension region forming mask. The threshold value is controlled also by the conditions of this process.

Figure 7K:
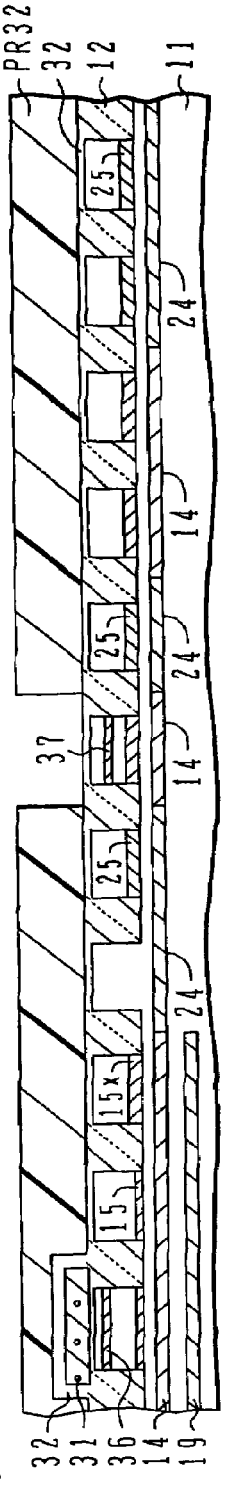

As shown in FIG. 7K, a photoresist mask PR32 is formed exposing the middle voltage n-channel MOS transistor N-MV region, and $B^+$ ions for forming the threshold value adjustment region 37 are implanted at an acceleration energy of 35 keV and a dose of 4.5E12. The resist mask PR32 is thereafter removed.

Figure 7L:
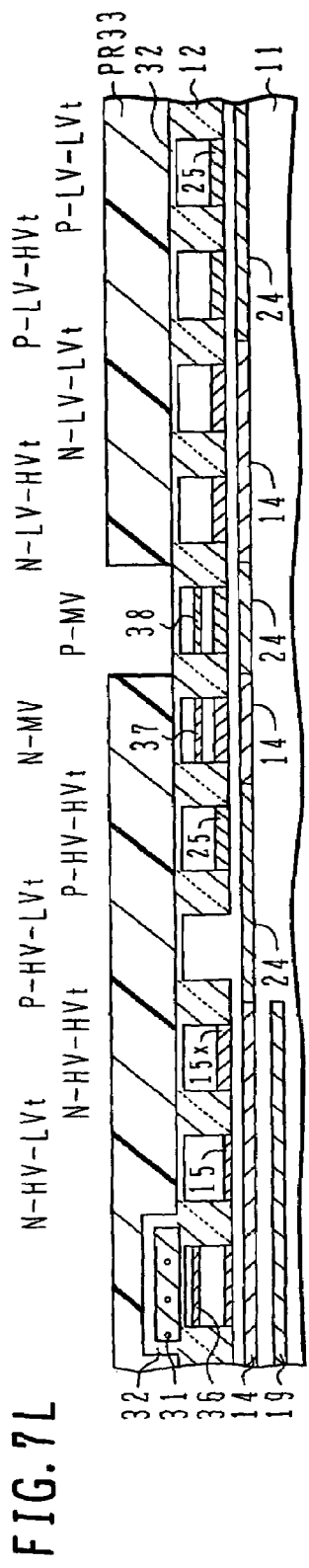

As shown in FIG. 7L, a photoresist mask PR33 is formed exposing the middle voltage p-channel MOS transistor P-MV region, and $As^+$ ions for forming the threshold value adjustment region 38 are implanted at an acceleration energy of 150 keV and a dose of 2.0E12. The resist mask PR33 is thereafter removed.

Figure 7M:
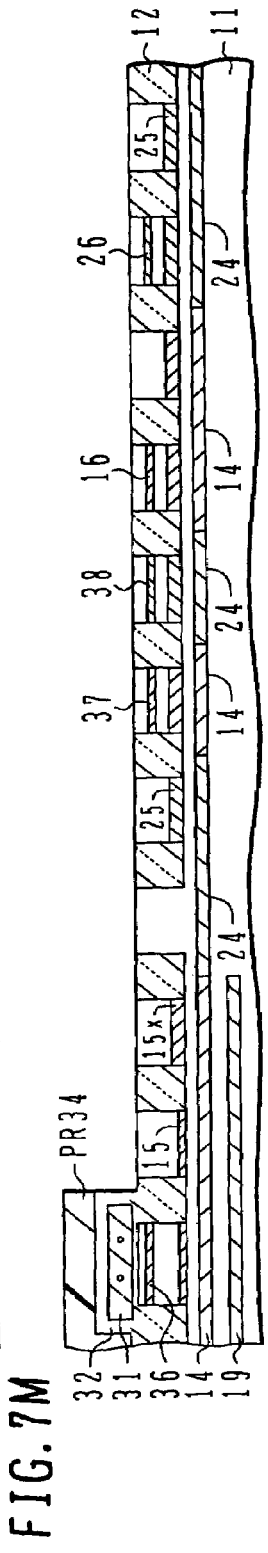

As shown in FIG. 7M, a photoresist mask PR34 is formed exposing the flash memory FM region, and the ONO film 32 in an area other than the flash memory FM region is removed. In this case, at least the ONO film 32 in a contact region of the first polysilicon transistor is removed so that it is not necessary to later form a contact hole through a second polysilicon layer and ONO film.

Figure 7N:
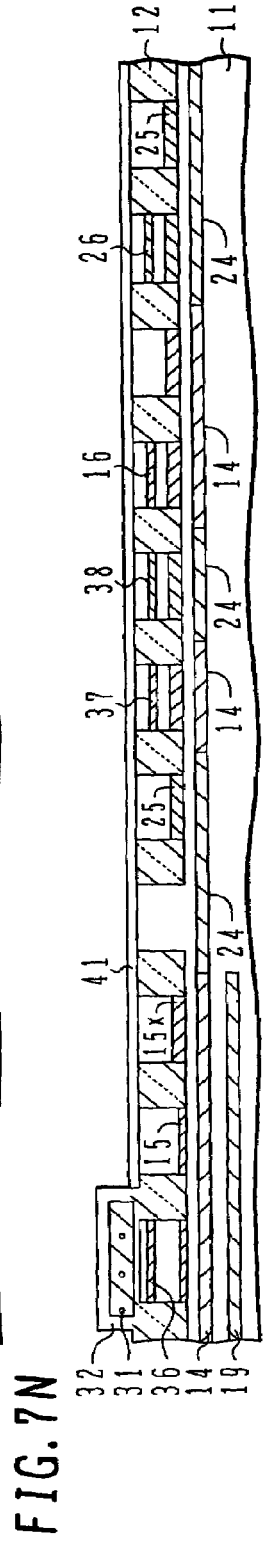

As shown in FIG. 7N, the substrate surface is thermally oxidized to form a silicon oxide film 41 having a thickness of 12 nm.

Figure 7O:
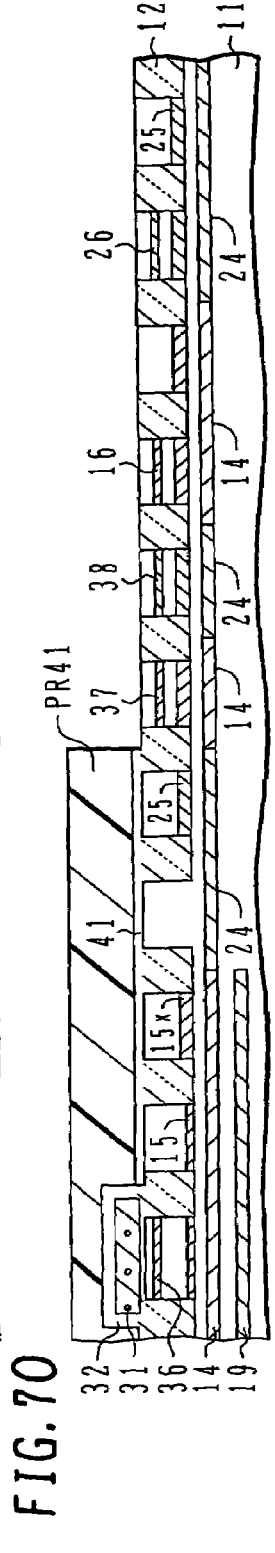

As shown in FIG. 7O, a resist mask PR41 is formed covering the flash memory FM region and high voltage transistor HV regions, and the silicon oxide film in the exposed regions is removed. The resist mask PR41 is thereafter removed.

Figure 7P:
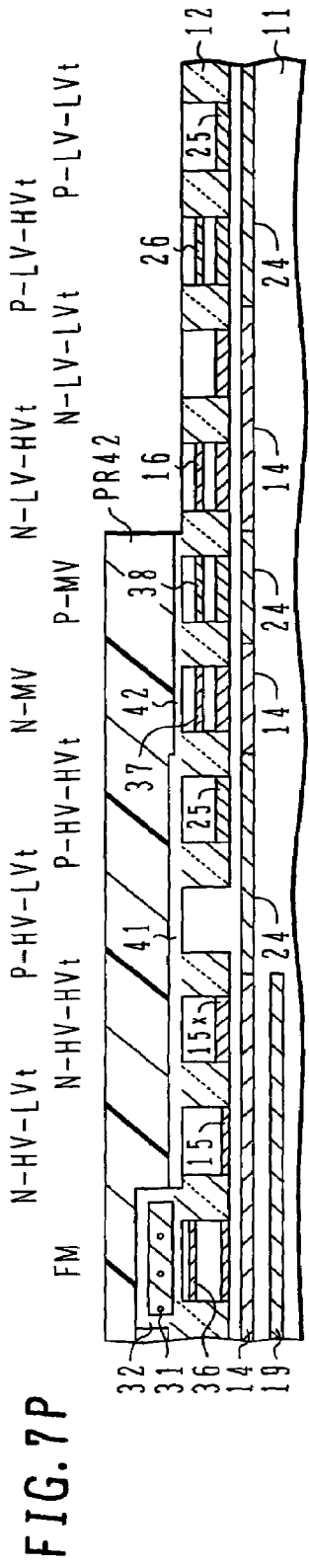

As shown in FIG. 7P, the exposed substrate surface is thermally oxidized to form a silicon oxide film 42 having a thickness of 7 nm for 3.3 V operation transistors. By using a resist mask PR42, the thermally oxidized film 42 in the low voltage transistor LV regions is removed.

Figure 7Q:
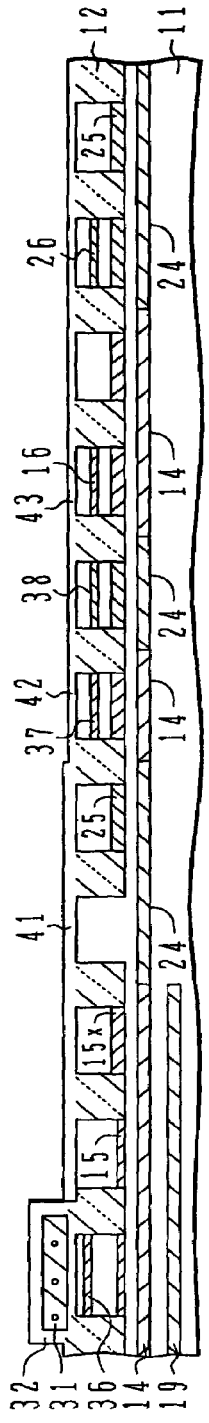

As shown in FIG. 7Q, the exposed substrate surface is thermally oxidized to form a silicon oxide film 43 having a thickness of 2.0 nm for 1.2 V operation transistors.

In the final state, the silicon oxide film in the 5 V region is 16 nm thick, the silicon oxide film in the 3.3 V region is 7.5 nm thick and the silicon oxide film in the 1.2 V region is 2.2 nm.

Figure 7R:
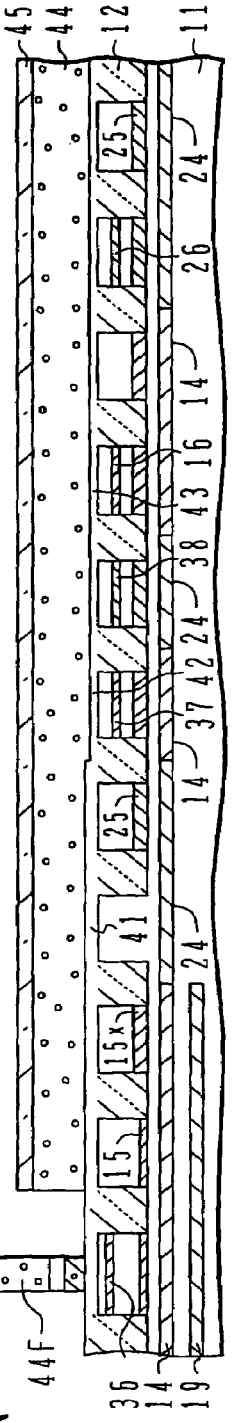

As shown in FIG. 7R, on the surface of the substrate having the gate insulating films of three different thicknesses, a polysilicon film 44 having a thickness of 180 nm is formed by CVD, and a silicon nitride film 45 having a thickness of 30 nm is deposited on the polysilicon film by plasma CVD. The silicon nitride film functions as an antireflection film and can also be used as an etch stopper. A gate electrode 44F of the flash memory cell is formed by photolithography and patterning.

Figure 7S:
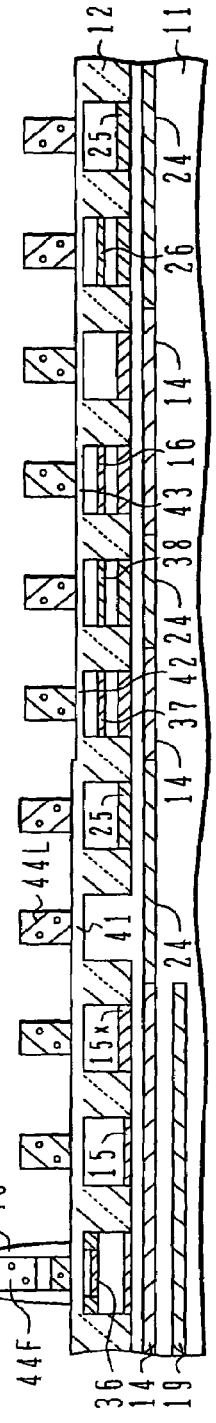

As shown in FIG. 7S, the side walls of the gate electrode of the flash memory cell are thermally oxidized to form a thermally oxidized film having a thickness of 10 nm, and As$^+$ ion implantation is performed at an acceleration energy of 50 keV and a dose of 6.0E14 to form source/drain regions. The side walls of the gate electrode of the flash memory cell are again thermally oxidized to grow a thermally oxidized film having a thickness of 9.5 nm. A silicon nitride film having a thickness of 115 nm is formed by thermal CVD, covering the gate electrode of the flash memory cell. RIE is performed to form side walls 46 of the silicon nitride film on the side walls of the gate electrode. This RIE removes the silicon nitride film 45 on the polysilicon film 44. Thereafter, the polysilicon film is selectively etched to leave the gate oxide films and pattern single gate electrodes 44L of the transistors in the peripheral circuit area, by photolithography and etching.

In the following, although description is partially duplicated, the detailed description will be given on the flash memory area and first polysilicon transistor area by showing one transistor as a simplified representation of the peripheral circuit.

Figure 8:
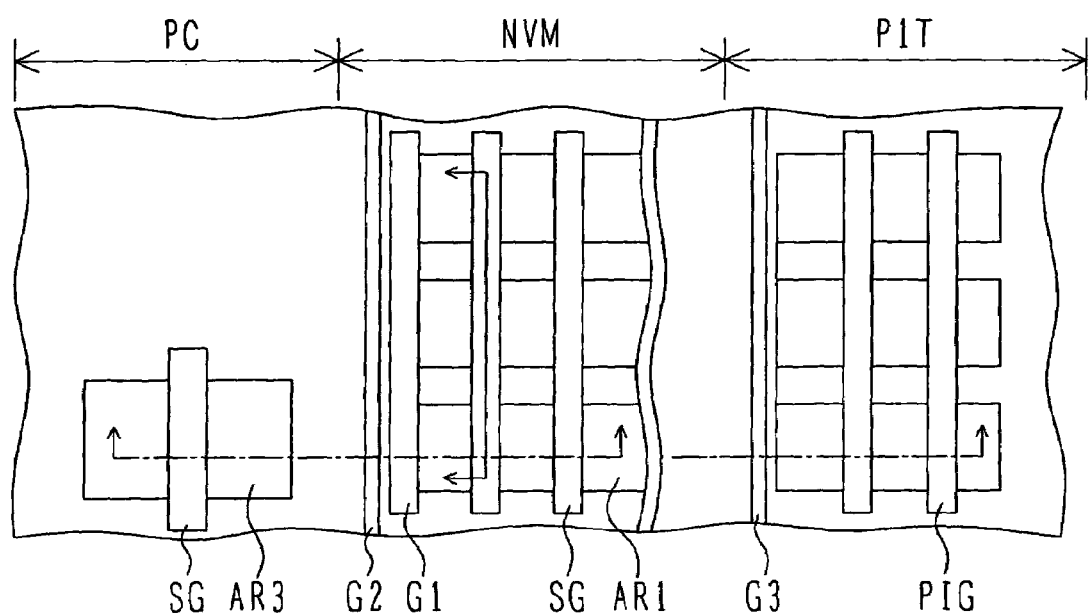
FIG. 8 is a schematic plan view showing an example of the layout of a non-volatile memory area, a first polysilicon transistor area and a peripheral circuit area of the semiconductor device shown in FIG. 6.

FIG. 8 is a plan layout of a semiconductor device. In a non-volatile memory area NVM and a first polysilicon transistor area P1T, a plurality of striped active regions AR1 and AR2 are disposed in parallel along a lateral direction (X direction). In the non-volatile memory region NVM, a plurality of laminated gate electrodes SG are formed crossing the active regions, and a first polysilicon guard G1 is disposed near the end of the active regions, and a second polysilicon guard G2 is disposed in the peripheral area of the active regions. In the first polysilicon transistor area P1T, a third polysilicon guard G3 is disposed in the peripheral area of the first polysilicon transistor area.

The first guard G1 corresponds to the above-described dummy control gate DCG, and the second and third guards G2 and G3 correspond to the above-described polysilicon guard PG. In the peripheral circuit area PC, one active region AR3 is shown and a single-layer gate SG made of the second polysilicon layer is disposed crossing the central area of the active region.

In the following, with reference to FIGS. 9A to 9H, description will be made on the manufacture processes for the semiconductor device shown in FIG. 8, by using a cross sectional view of the area from the peripheral circuit area to the non-volatile memory area along the lateral direction (X direction) of active region extension, a cross sectional view of the non-volatile memory area along a vertical direction (Y direction) of laminated gate extension and cross sectional views of the first polysilicon transistor area along the X and Y directions.

FIG. 9A shows the state that a first polysilicon layer 31 is formed and patterned and then a laminated insulating layer (ONO) 32 is formed. A shallow trench isolation (STI) 12 and p-type wells Wp1 and Wp2 are formed in a p-type silicon substrate 11. In the peripheral circuit area, a sacrificial oxide film Sox is formed, and in the non-volatile memory area and first polysilicon transistor area, a tunneling oxide film Tox is formed. In the non-volatile memory area, the first polysilicon layer 31 is patterned in stripe shapes covering active regions, and in the first polysilicon transistor area, it is patterned in the shape covering the whole area. The side walls of the first polysilicon layers 31 are covered with the laminated insulating film 32.

FIG. 9B shows the state that a second polysilicon layer 44 and a silicon nitride film 45 are deposited and a resist mask RM1 is formed on the silicon nitride film. In the non-volatile memory area NVM, the resist mask is disposed covering the side wall of the first polysilicon layer 31 at the edge of the active region AR1, and in the first polysilicon transistor area P1T, it is disposed covering the peripheral side wall of the first polysilicon layer 31 on STI 12. The silicon nitride film 45, second polysilicon layer 44, ONO film 32 and first polysilicon layer 31 are etched by using the resist mask RM1 as an etching mask. Polysilicon guards PG shown in FIGS. 2X2, 2Y2, 4X3 and 4Y3 are formed covering the ONO films 32 formed on the side walls of the first polysilicon layers.

FIG. 9C illustrates a process of thermally oxidizing the side walls of the patterned laminated gate electrode to form thermally oxidized films Pox and implanting n-type impurity ions to form source/drain regions 51 in active regions AR1 and AR2 on both sides of the laminated gate electrodes.

Figure 9D:
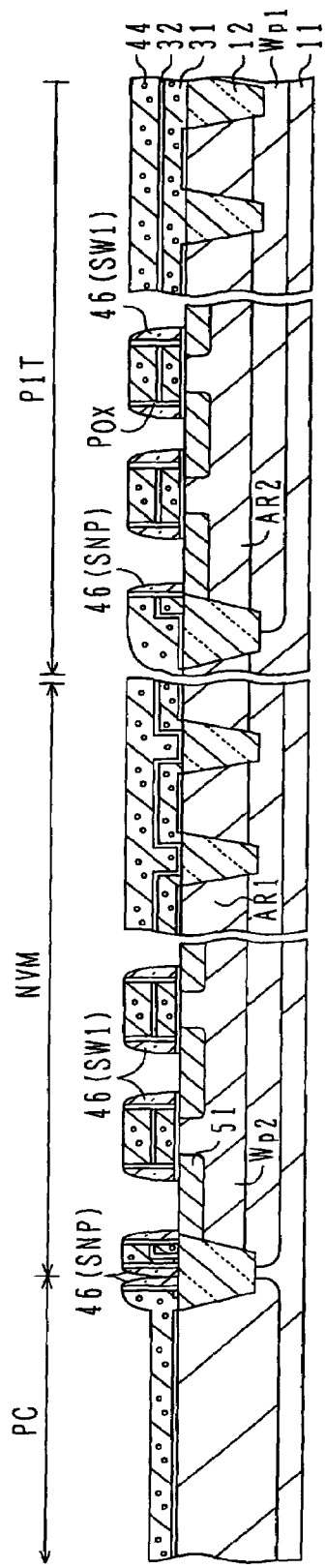

As shown in FIG. 9D, a silicon nitride layer 46 is deposited on the substrate, and RIE is performed to form side walls SW1 of silicon nitride. In this case, the silicon nitride films 45 as the antireflection films is also removed. The side walls SW1 are therefore formed on the side walls of the laminated gate electrode, and silicon nitride pillars SNP are formed on the side walls of the second polysilicon layers 44 in the peripheral circuit area.

Figure 9E:
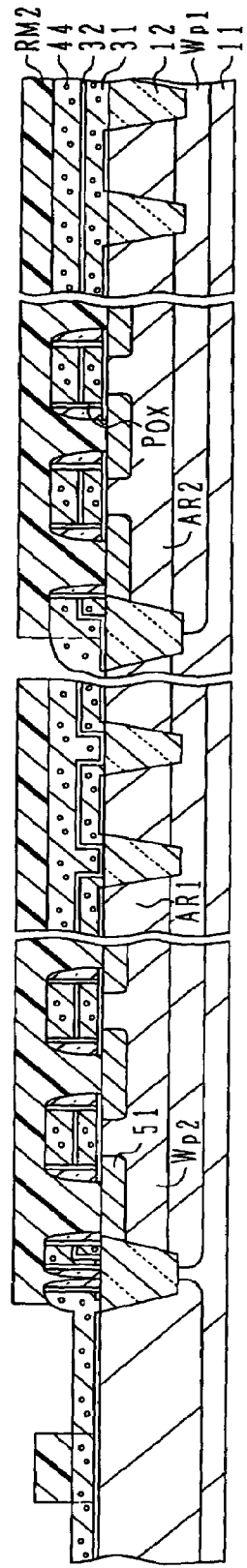

As shown in FIG. 9E, a resist mask RM2 is formed for patterning single-layer gate electrodes in the peripheral circuit area. The resist mask RM2 has a pattern of single-layer gate shapes and a pattern covering the non-volatile memory area NVM, first polysilicon transistor area P1T, polysilicon guards PG and silicon nitride pillars SNP.

Figure 9F:
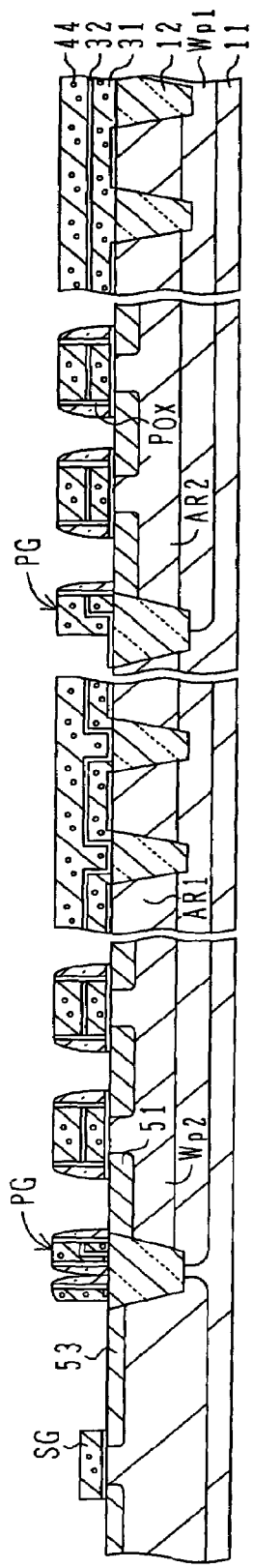

As shown in FIG. 9F, after patterning the single-layer gate electrodes in the peripheral circuit area, ion implantation is performed for forming source/drain regions 53. The resist mask RM2 is thereafter removed. The laminated gate electrodes in the non-volatile memory area and first polysilicon transistor area and the side walls of the laminated polysilicon layers formed with the polysilicon guards PG, silicon nitride pillars SNP are therefore left.

Figure 9G:
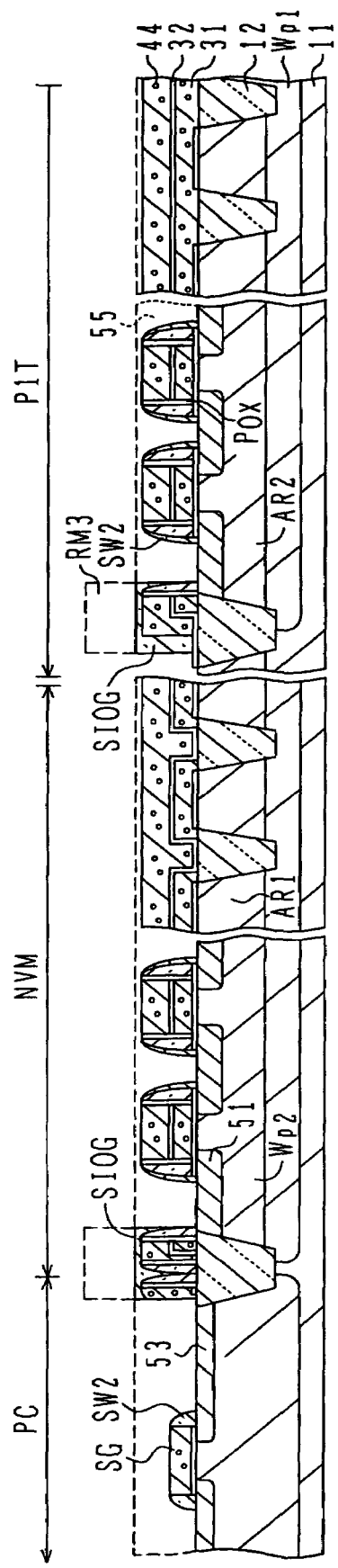

As shown in FIG. 9G, a silicon oxide film is deposited by thermal CVD, and RIE is performed to form side walls SW2. In this case, before RIE, a resist mask RM3 is formed covering the polysilicon guards PG and silicon nitride pillars SNP. Silicon oxide guards SIOG are therefore formed which have silicon oxide films formed on the polysilicon guards PG and silicon nitride pillars SNP. The resist mask RM3 is thereafter removed.

Figure 9H:
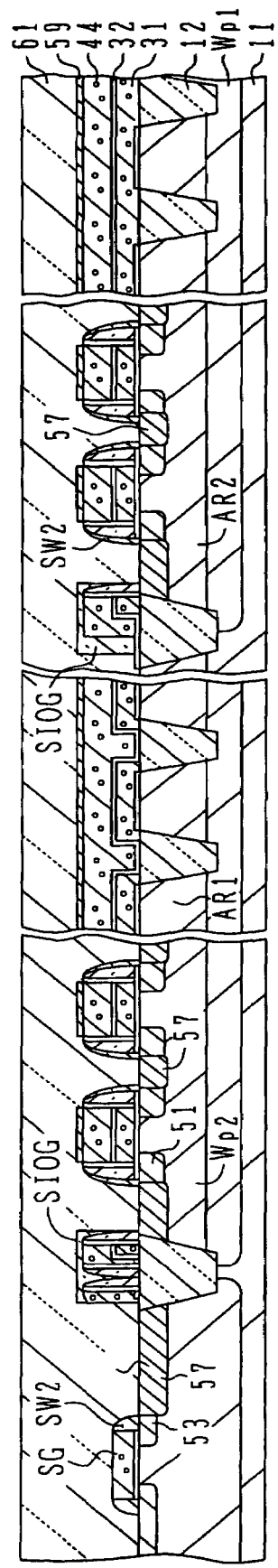
Figure 10A:
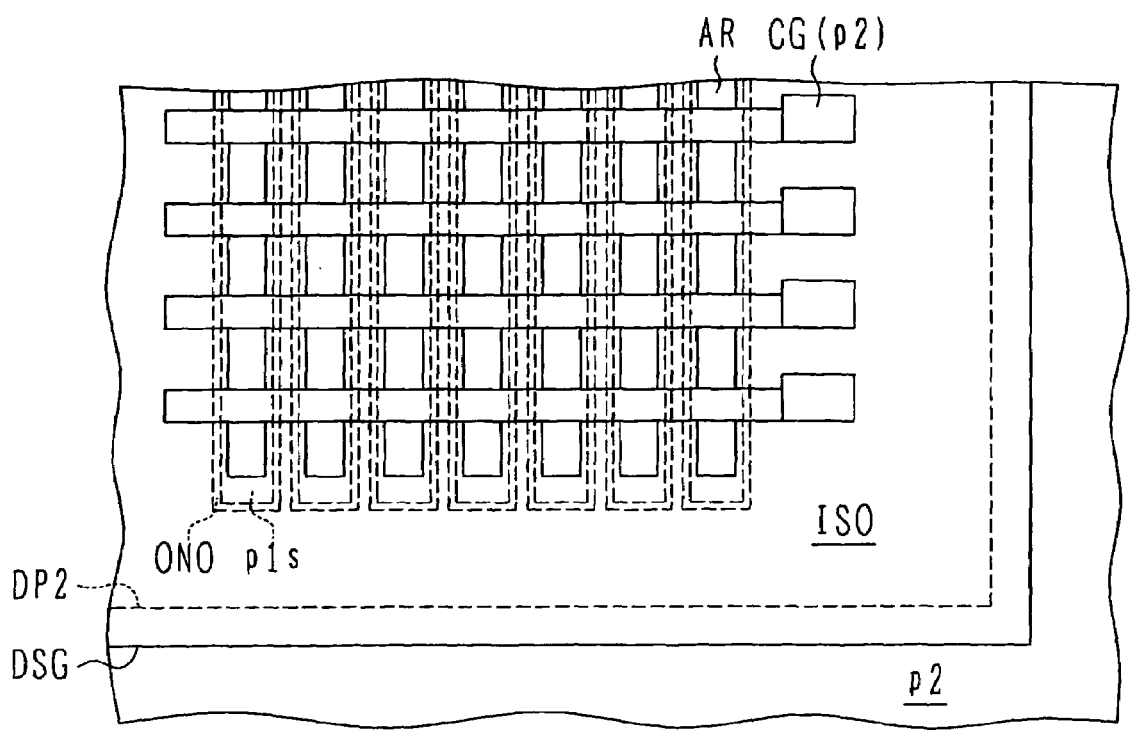
FIGS. 10A and 10B are plan views showing examples of the layouts of a non-volatile memory area and a first polysilicon transistor area of a semiconductor device according to prior art.
Figure 10B:
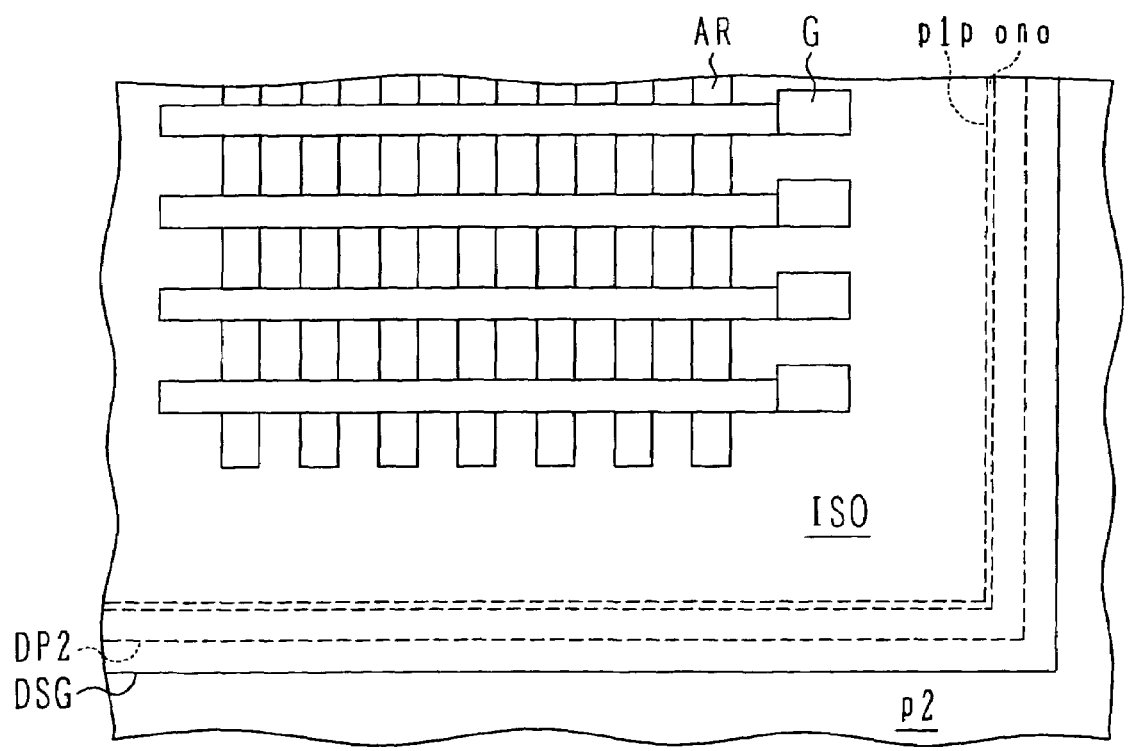

As shown in FIG. 9H, n-type impurity ions are implanted to form high concentration source/drain regions 57. A Co film and a TiN film are deposited by sputtering and heat treatment is performed to conduct a primary silicidation reaction between Co and Si. The TiN film and unreacted Co film are washed out. Heat treatment is performed again to conduct a secondary silicidation reaction to form sufficiently low resistance silicide films 59. An interlayer insulating film 61 such as silicon oxide is deposited on the substrate. Contact holes are formed and conductive plugs are buried. A desired number of interlayer insulating films and wiring layers are formed to form a multi-layer wiring structure.

The present invention has been described in connection with the preferred embodiments. The invention is not limited only to the above embodiments. For example, various well-known technologies may be adopted for semiconductor devices and their manufacture methods. It will be apparent to those skilled in the art that other various modifications, improvements, combinations, and the like can be made.

What we claim are:

1. A non-volatile semiconductor memory device comprising:
    a semiconductor substrate;
    a non-volatile memory area including a non-volatile memory cell having a gate electrode including a floating gate, an inter-electrode insulating film and a control gate stacked above said semiconductor substrate and having first insulating side walls formed on side walls of said gate electrode;
    wherein said control gate comprises a first material and said first insulating side walls comprises a second material;
    a peripheral circuit area including a transistor having a single-layer gate electrode formed above said semiconductor substrate, said single-layer gate electrode being comprised of said first material;
    a first border area including: a first isolation region formed in said semiconductor substrate for isolating said non-volatile memory area and said peripheral circuit area; a first residual pattern including an insulating film directly formed on said first isolation region in entire direct contact thereto, and made of a same layer as said inter-electrode insulating film and a single conductive layer formed on said insulating film in direct contact thereto, and a first redundant insulating side wall comprised of a same layer as said first insulating side walls and formed on a side wall of said first residual pattern on a side of said non-volatile memory area; and
    wherein said floating gate is comprised of a first polysilicon and wherein said first residual pattern is free of said first polysilicon.

2. The non-volatile semiconductor memory device according to claim 1, wherein:
    said peripheral circuit area has a second insulating side wall comprising a third material formed on side walls of said single-layer gate electrode; and
    said first border area has an insulating upper layer comprising said third material and formed on said first redundant insulating side wall.

3. The non-volatile semiconductor memory device according to claim 1, further comprising:
    a laminated gate transistor area including a laminated gate transistor having a laminated gate electrode including a floating gate, an inter-electrode insulating film and a control gate stacked above said semiconductor substrate, similar to said non-volatile memory area, and having first insulating side walls formed on side walls of said laminated gate electrode, said laminated gate transistor using said floating gate as a gate electrode; and
    a second border area including: a second isolation region formed in said semiconductor substrate for isolating said laminated gate transistor area and said peripheral circuit area; a second conductive pattern including a portion made of a same layer as the layer of said control gate and formed above said semiconductor substrate including said second isolation region; and a second redundant insulating side wall made of a same layer as the layer of said first insulating side wall and formed on a side wall of said second conductive pattern on a side of said laminated gate transistor area.

4. The non-volatile semiconductor memory device according to claim 3, wherein said second conductivity pattern includes a lower layer portion made of a same layer as a layer of said floating gate and an upper layer portion made of a same layer as the layer of said control gate, on a side of said laminated gate transistor area, and includes only a portion made of a same layer as the layer of said control gate on a side of said peripheral circuit area.

5. The non-volatile semiconductor memory device according to claim 1, further comprising an insulating film fence preventive structure near at ends of an active region in said non-volatile memory area, said insulating film fence preventive structure including a dummy floating gate made of a same layer of a layer of said floating gate, an insulating film made of a same layer as a layer of said inter-electrode insulating film and formed on an upper surface and a side wall of said dummy floating gate not facing said active region, and a dummy control gate made of a same layer as the layer of said control gate.

6. A non-volatile semiconductor memory device comprising:
    a semiconductor substrate;
    a non-volatile memory area including a non-volatile memory cell having a gate electrode including a floating gate, an inter-electrode insulating film and a control gate stacked above said semiconductor substrate and having first insulating side walls made of a first insulating material, and formed on side walls of said gate electrode;
    a peripheral circuit area including a transistor having a single-layer gate electrode formed above said semiconductor substrate and second insulating side walls made of a second insulating material different from the first insulating material, and formed on side walls of said single-layer gate electrode, said single-layer gate electrode being made of a same layer as a layer of said control gate; and
    a first border area including: a first isolation region formed in said semiconductor substrate for isolating said non-volatile memory area and said peripheral circuit area; a first conductive pattern including a portion made of a same layer as the layer of said control gate and formed above said semiconductor substrate including said first isolation region; and a first redundant insulating side wall made of said first insulating material and formed on a side wall of said first conductive pattern on a side of said non-volatile memory area and a second redundant insulating layer made of said second insulating material and formed on said first redundant insulating side wall.

7. The non-volatile semiconductor memory device according to claim 6, wherein: said first insulating material is silicon nitride, and said second insulating material is silicon oxide.

8. The non-volatile semiconductor memory device according to claim 6, wherein said first conductive pattern includes lamination of layers made of same layers as said gate electrode of said non-volatile memory cell.

9. The non-volatile semiconductor memory device according to claim 6, further comprising:
    a laminated gate transistor area including a laminated gate transistor having a laminated gate electrode including a floating gate, an inter-electrode insulating film and a control gate stacked above said semiconductor substrate, similar to said non-volatile memory area, and having first insulating side walls formed on side walls of said laminated gate electrode, said laminated gate transistor using said floating gate as a gate electrode; and a second border area including: a second isolation region formed in said semiconductor substrate for isolating said laminated gate transistor area and said peripheral circuit area; a second conductive pattern including a portion made of a same layer as the layer of said control gate and formed above said semiconductor substrate including said second isolation region; and a second redundant insulating side wall made of a same layer as the layer of said first insulating side wall and formed on a side wall of said second conductive pattern on a side of said laminated gate transistor area.

10. The non-volatile semiconductor memory device according to claim 9, wherein said second conductivity pattern includes a lower layer portion made of a same layer as a layer of said floating gate and an upper layer portion made of a same layer as the layer of said control gate, on a side of said laminated gate transistor area, and includes only a portion made of a same layer as the layer of said control gate on a side of said peripheral circuit area.

11. The non-volatile semiconductor memory device according to claim 6, further comprising an insulating film fence preventive structure near at ends of an active region in said non-volatile memory area, said insulating film fence preventive structure including a dummy floating gate made of a same layer of a layer of said floating gate, an insulating film made of a same layer as a layer of said inter-electrode insulating film and formed on an upper surface and a side wall of said dummy floating gate not facing said active region, and a dummy control gate made of a same layer as the layer of said control gate.

12. The non-volatile semiconductor memory device according to claim 1, wherein said insulating film is entirely planar.

* * * * *